US012592538B2

(12) United States Patent
Tanaka et al.

(10) Patent No.: US 12,592,538 B2
(45) Date of Patent: Mar. 31, 2026

(54) SOLID-STATE LASER SYSTEM, PHASE MATCHING METHOD, AND ELECTRONIC DEVICE MANUFACTURING METHOD

(71) Applicant: Gigaphoton Inc., Tochigi (JP)

(72) Inventors: Yohei Tanaka, Oyama (JP); Chen Qu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 581 days.

(21) Appl. No.: 18/164,376

(22) Filed: Feb. 3, 2023

(65) Prior Publication Data

US 2023/0178957 A1 Jun. 8, 2023

Related U.S. Application Data

(63) Continuation of application No. PCT/JP2020/033415, filed on Sep. 3, 2020.

(51) Int. Cl.
H01S 3/10 (2006.01)
G02F 1/35 (2006.01)
(Continued)

(52) U.S. Cl.
CPC ............ H01S 3/109 (2013.01); G02F 1/3544 (2013.01); G02F 1/37 (2013.01); H01S 3/0092 (2013.01);
(Continued)

(58) Field of Classification Search
CPC ........ H01S 3/109; H01S 3/0092; H01S 3/025; H01S 3/2375; H01S 3/2391; H01S 3/06754; H01S 5/50
See application file for complete search history.

(56) References Cited

U.S. PATENT DOCUMENTS 4,649,544 A * 3/1987 Haas ....................... H01S 3/131
372/27
5,640,405 A * 6/1997 Wallace ................ G02F 1/3532
372/98
(Continued)

FOREIGN PATENT DOCUMENTS

CN 107210576 A 9/2017
JP H03-252186 A 11/1991
(Continued)

OTHER PUBLICATIONS

International Search Report issued in PCT/JP2020/033415; mailed Nov. 24, 2020.
(Continued)

*Primary Examiner* — Kinam Park
(74) *Attorney, Agent, or Firm* — Studebaker Brackett PLLC

(57) ABSTRACT

A solid-state laser system according to an aspect of the present disclosure includes a first non-linear crystal that generates first wavelength-converted light based on a first laser beam, a first adjustment unit configured to perform phase matching of the first wavelength-converted light in the first non-linear crystal, a second non-linear crystal that generates second wavelength-converted light based on a second laser beam and the first wavelength-converted light, a second adjustment unit configured to perform phase matching of the second wavelength-converted light in the second non-linear crystal, a light detection unit configured to detect light having a selected wavelength, and a processor configured to control the first adjustment unit based on intensity of at least one of the first wavelength-converted light and the first laser beam and to control the second adjustment unit based on intensity of at least one of the
(Continued)

second wavelength-converted light and the first wavelength-converted light.

18 Claims, 22 Drawing Sheets

(51) Int. Cl.

| | | |
|---|---|---|
| *G02F 1/37* | (2006.01) |
| *H01S 3/00* | (2006.01) |
| *H01S 3/02* | (2006.01) |
| *H01S 3/109* | (2006.01) |
| *H01S 3/23* | (2006.01) |
| *H01S 3/067* | (2006.01) |
| *H01S 5/50* | (2006.01) |

(52) U.S. Cl.
CPC ........... *H01S 3/025* (2013.01); *H01S 3/2375* (2013.01); *H01S 3/2391* (2013.01); *H01S 3/06754* (2013.01); *H01S 5/50* (2013.01)

(56) References Cited

U.S. PATENT DOCUMENTS

| | | | |
|---|---|---|---|
| 5,936,985 A | | 8/1999 | Yamamoto et al. |
| RE43,421 E | * | 5/2012 | Zhang ................... H01S 3/0941 372/19 |
| 11,226,536 B2 | * | 1/2022 | Qu ........................ G02F 1/3534 |
| 2004/0252734 A1 | * | 12/2004 | Karpushko ............. H01S 3/109 372/22 |

| | | | |
|---|---|---|---|
| 2007/0286248 A1 | | 12/2007 | Lee |
| 2017/0338619 A1 | | 11/2017 | Onose et al. |
| 2020/0363697 A1 | * | 11/2020 | Qu ....................... G03F 7/70041 |
| 2022/0155650 A1 | * | 5/2022 | Qu ............................ G02F 1/37 |
| 2023/0124281 A1 | * | 4/2023 | Runcorn ............. H01S 3/10092 372/3 |

FOREIGN PATENT DOCUMENTS

| | | |
|---|---|---|
| JP | H08-211433 A | 8/1996 |
| JP | 2003-315859 A | 11/2003 |
| JP | 2006-030594 A | 2/2006 |
| JP | 2010-256784 A | 11/2010 |
| JP | 2011-059324 A | 3/2011 |
| JP | 2015-155933 A | 8/2015 |
| WO | 2016/142996 A1 | 9/2016 |

OTHER PUBLICATIONS

International Preliminary Report On Patentability (Chapter I) and Written Opinion of the International Searching Authority issued in PCT/JP2020/033415; issued Mar. 7, 2023.

An Office Action; mailed by the China National Intellectual Property Administration of the People's Republic of China on May 29, 2025, which corresponds to Chinese Patent Application No. 202080104254.1 and is related to U.S. Appl. No. 18/164,376.

An Office Action issued by the Japanese Patent Office on May 7, 2024, which corresponds to Japanese Patent Application 2022-546793 and is related to U.S. Appl. No. 18/164,376.

\* cited by examiner

Fig. 6

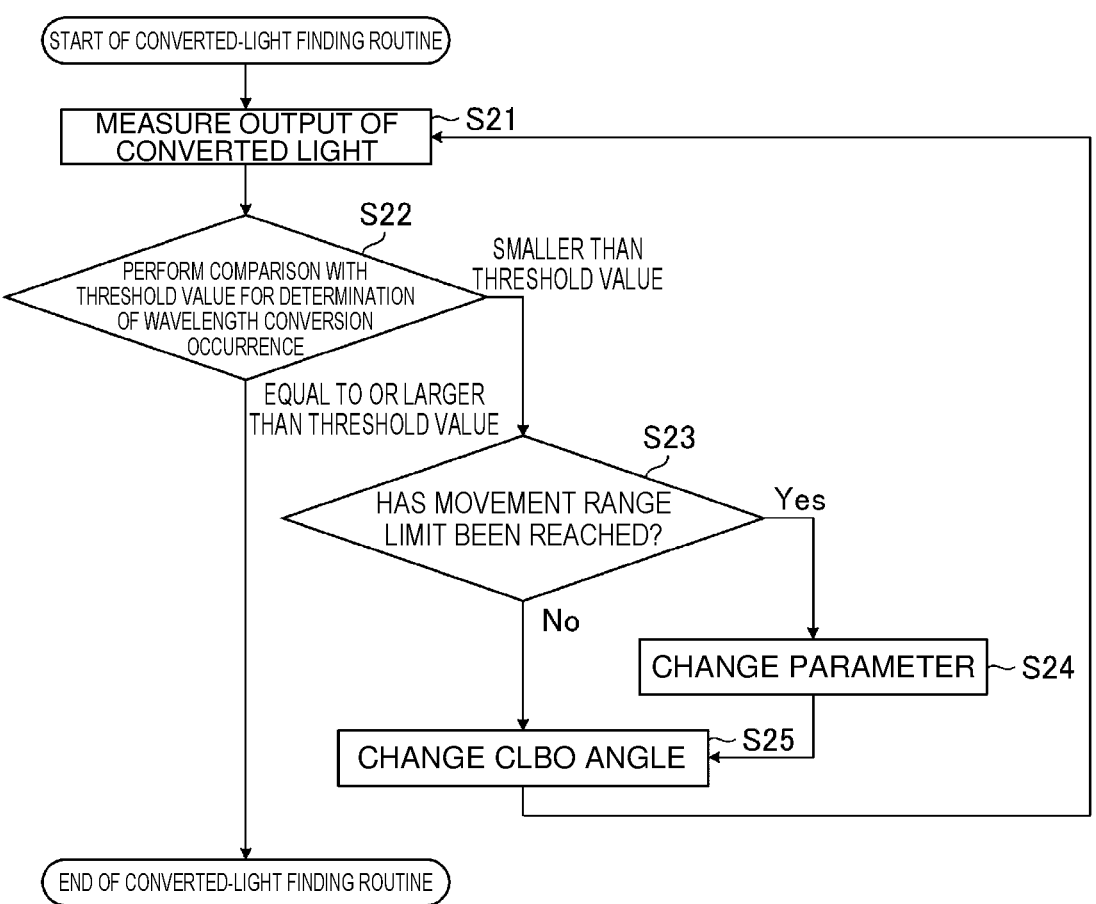

START OF CONVERTED-LIGHT FINDING ROUTINE

MEASURE OUTPUT OF CONVERTED LIGHT ~S21

S22

PERFORM COMPARISON WITH THRESHOLD VALUE FOR DETERMINATION OF WAVELENGTH CONVERSION OCCURRENCE

SMALLER THAN THRESHOLD VALUE

EQUAL TO OR LARGER THAN THRESHOLD VALUE

S23

HAS MOVEMENT RANGE LIMIT BEEN REACHED?

Yes

No

CHANGE PARAMETER ~S24

CHANGE CLBO ANGLE ~S25

END OF CONVERTED-LIGHT FINDING ROUTINE

Fig. 7

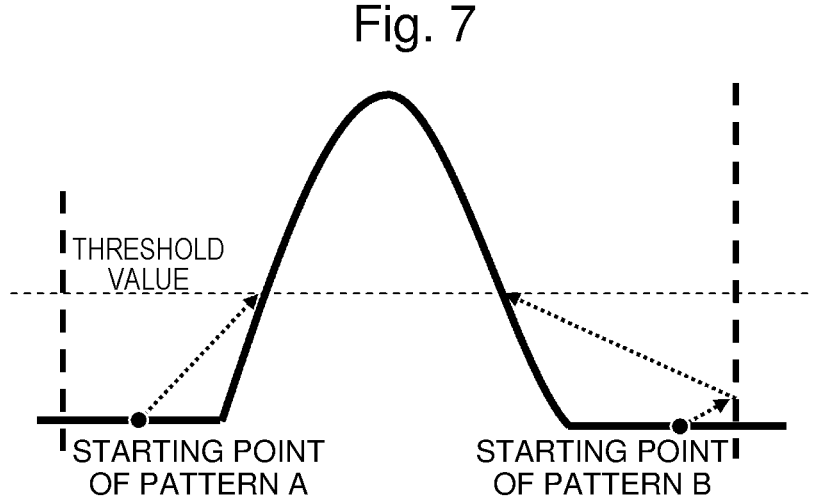

THRESHOLD VALUE

STARTING POINT OF PATTERN A

STARTING POINT OF PATTERN B

Fig. 12

OUTPUT OF NON-
CONVERTED LIGHT
(FIRST SUM
FREQUENCY LIGHT)

OUTPUT OF
CONVERTED LIGHT
(SECOND SUM
FREQUENCY LIGHT)

Fig. 15

START OF INITIAL ALIGNMENT

SECOND-HARMONIC-LIGHT FINDING ROUTINE FOR CLBO1 — S11

SECOND-HARMONIC-LIGHT PEAK-VALUE SEARCH ROUTINE FOR CLBO1 — S12

FIRST-SUM-FREQUENCY-LIGHT FINDING ROUTINE FOR CLBO2 — S13

FIRST-SUM-FREQUENCY-LIGHT PEAK-VALUE
SEARCH ROUTINE FOR CLBO2 — S14

SECOND-SUM-FREQUENCY-LIGHT FINDING
ROUTINE BASED ON FIRST-SUM-FREQUENCY-
LIGHT OUTPUT MEASUREMENT FOR CLBO3 — S17

FIRST-SUM-FREQUENCY-LIGHT BOTTOM-VALUE
SEARCH ROUTINE FOR CLBO3 — S18

END OF INITIAL ALIGNMENT

Fig. 16

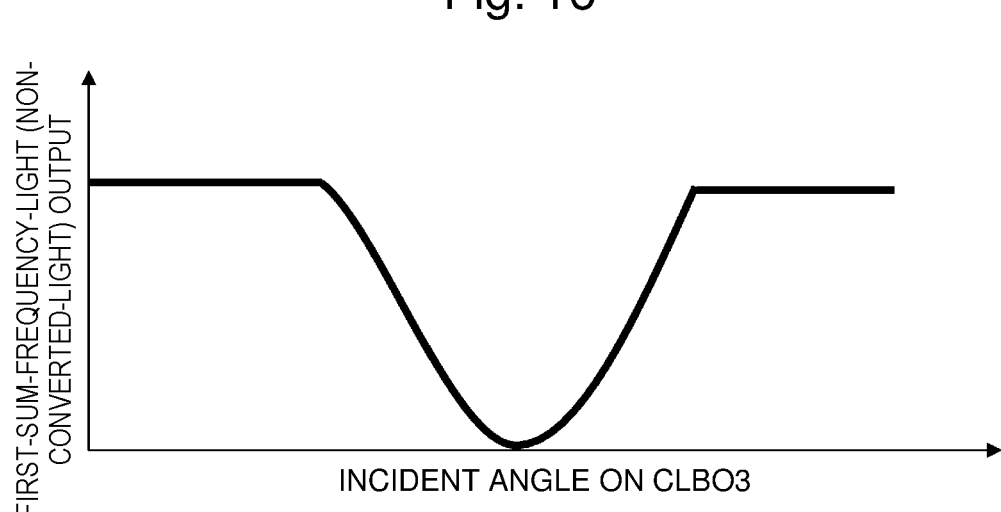

FIRST-SUM-FREQUENCY-LIGHT (NON-CONVERTED-LIGHT) OUTPUT

INCIDENT ANGLE ON CLBO3

Fig. 17

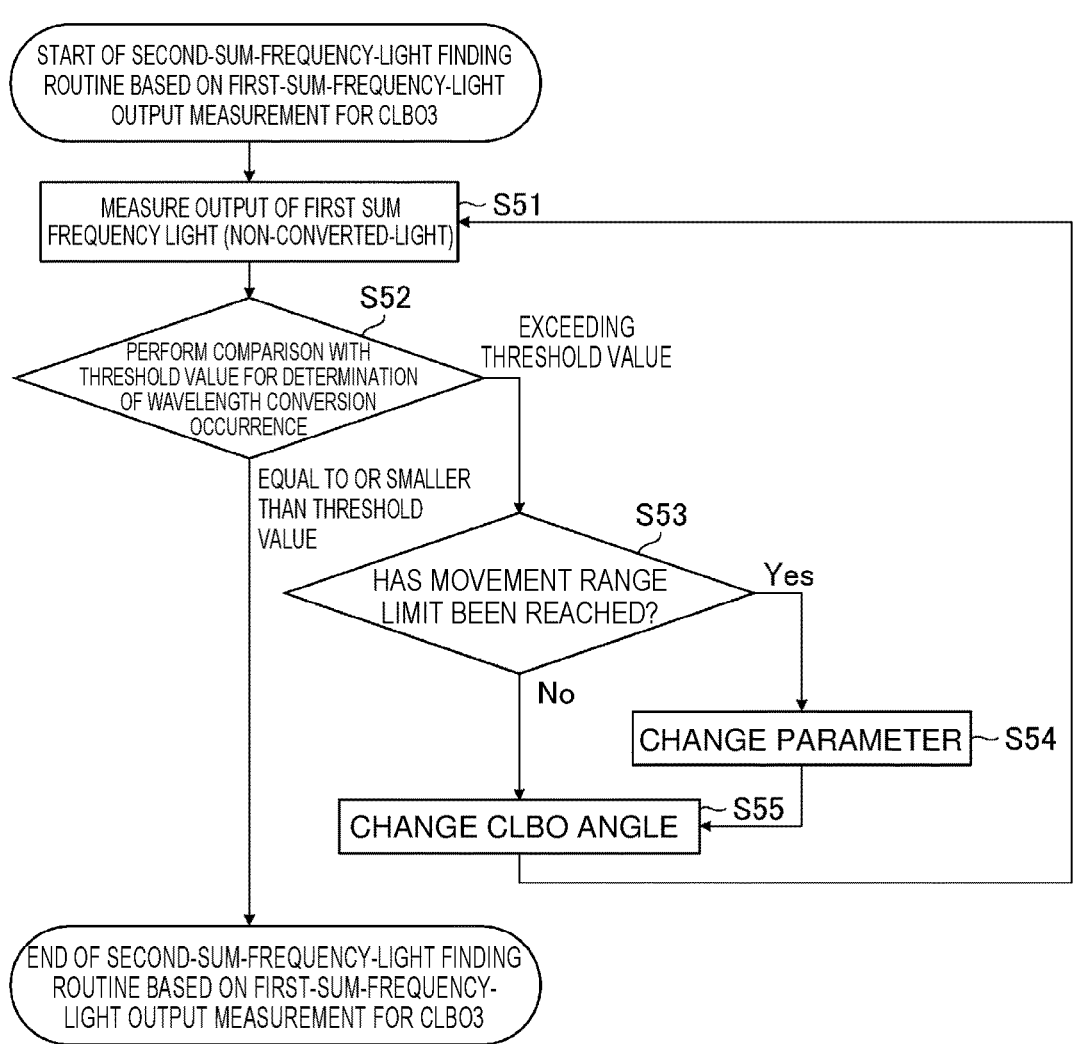

START OF SECOND-SUM-FREQUENCY-LIGHT FINDING
ROUTINE BASED ON FIRST-SUM-FREQUENCY-LIGHT
OUTPUT MEASUREMENT FOR CLBO3

MEASURE OUTPUT OF FIRST SUM
FREQUENCY LIGHT (NON-CONVERTED-LIGHT) — S51

S52
PERFORM COMPARISON WITH
THRESHOLD VALUE FOR DETERMINATION
OF WAVELENGTH CONVERSION
OCCURRENCE

EXCEEDING
THRESHOLD VALUE

EQUAL TO OR SMALLER
THAN THRESHOLD
VALUE

S53
HAS MOVEMENT RANGE
LIMIT BEEN REACHED?     Yes

No

CHANGE PARAMETER — S54

CHANGE CLBO ANGLE ◄— S55

END OF SECOND-SUM-FREQUENCY-LIGHT FINDING
ROUTINE BASED ON FIRST-SUM-FREQUENCY-
LIGHT OUTPUT MEASUREMENT FOR CLBO3

Fig. 18

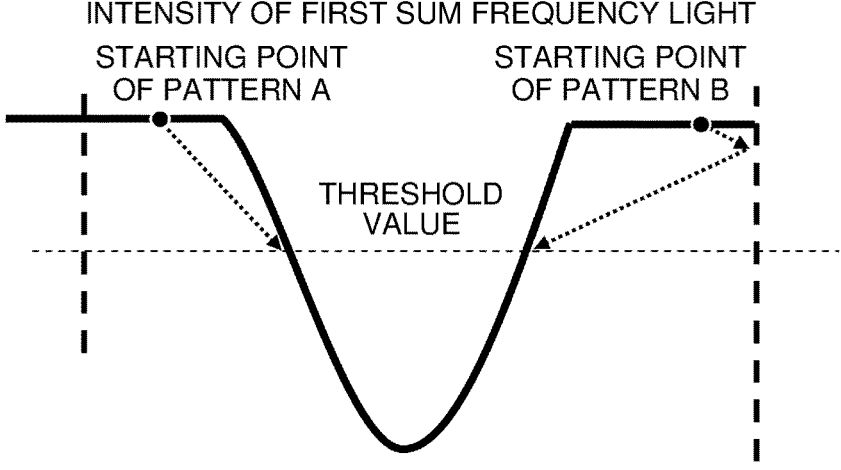

INTENSITY OF FIRST SUM FREQUENCY LIGHT

STARTING POINT
OF PATTERN A

STARTING POINT
OF PATTERN B

THRESHOLD
VALUE

Fig. 22

PREDICT PEAK POSITION

CALCULATE
CURVE x3

MULTIPLE-POINT
MEASUREMENT   x2 x1

SOLID-STATE LASER SYSTEM, PHASE MATCHING METHOD, AND ELECTRONIC DEVICE MANUFACTURING METHOD

CROSS-REFERENCE TO RELATED APPLICATIONS

The present application is a continuation application of International Application No. PCT/JP2020/033415, filed on Sep. 3, 2020, the entire contents of which are hereby incorporated by reference.

BACKGROUND

1. Technical Field

The present disclosure relates to a solid-state laser system, a phase matching method, and an electronic device manufacturing method.

2. Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of a gas laser apparatus for exposure include a KrF excimer laser apparatus configured to output a laser beam having a wavelength of 248 nm approximately and an ArF excimer laser apparatus configured to output a laser beam having a wavelength of 193 nm approximately.

The KrF excimer laser apparatus and the ArF excimer laser apparatus have a wide spectrum line width of 350 pm to 400 pm for spontaneous oscillation light. Thus, chromatic aberration occurs in some cases when a projection lens is made of a material that transmits ultraviolet light such as a KrF or ArF laser beam. As a result, resolving power potentially decreases. Thus, the spectrum line width of a laser beam output from such a gas laser apparatus needs to be narrowed until chromatic aberration becomes negligible. To narrow the spectrum line width, a line narrowing module (LNM) including a line narrowing element (for example, etalon or grating) is provided in a laser resonator of the gas laser apparatus in some cases. In the following description, a gas laser apparatus that achieves narrowing of the spectrum line width is referred to as a line narrowed gas laser apparatus.

LIST OF DOCUMENTS

Patent Documents

Patent Document 1: Japanese Unexamined Patent Application Publication No. 2006-30594
Patent Document 2: Japanese Unexamined Patent Application Publication No. 2015-155933

SUMMARY

A solid-state laser system according to an aspect of the present disclosure includes a first laser apparatus configured to output a first laser beam, a second laser apparatus configured to output a second laser beam, a first non-linear crystal that generates first wavelength-converted light based on the first laser beam, a first adjustment unit configured to perform phase matching of the first wavelength-converted light in the first non-linear crystal, a second non-linear crystal that is disposed on an optical path of the first wavelength-converted light and generates second wavelength-converted light based on the first wavelength-converted light and the second laser beam, a second adjustment unit configured to perform phase matching of the second wavelength-converted light in the second non-linear crystal, a wavelength selection element disposed on an optical path of light output from the second non-linear crystal, a light detection unit configured to detect light having a wavelength selected by passing through the wavelength selection element, and a processor configured to control the first adjustment unit based on intensity of at least one of the first wavelength-converted light and the first laser beam having passed through the second non-linear crystal and detected by the light detection unit and to control the second adjustment unit based on intensity of at least one of the second wavelength-converted light detected by the light detection unit and the first wavelength-converted light having passed through the second non-linear crystal and detected by the light detection unit.

A phase matching method according to another aspect of the present disclosure is a phase matching method for a wavelength conversion system including a first non-linear crystal that generates first wavelength-converted light based on a first laser beam and a second non-linear crystal that generates second wavelength-converted light based on the first wavelength-converted light output from the first non-linear crystal and a second laser beam. The phase matching method includes detecting at least one of the first wavelength-converted light and the first laser beam having passed through the second non-linear crystal, performing phase matching of the first wavelength-converted light in the first non-linear crystal based on intensity of at least one of the first wavelength-converted light and the first laser beam thus detected, detecting at least one of the second wavelength-converted light output from the second non-linear crystal and the first wavelength-converted light having passed through the second non-linear crystal after having performed adjustment in which the phase matching of the first wavelength-converted light is performed in the first non-linear crystal, and performing phase matching of second wavelength-converted light in the second non-linear crystal based on intensity of at least one of the second wavelength-converted light and the first wavelength-converted light thus detected.

An electronic device manufacturing method according to another aspect of the present disclosure includes generating a third laser beam by using a solid-state laser system, the solid-state laser system including a first laser apparatus configured to output a first laser beam, a second laser apparatus configured to output a second laser beam, a first non-linear crystal that generates first wavelength-converted light based on the first laser beam, a first adjustment unit configured to perform phase matching of the first wavelength-converted light in the first non-linear crystal, a second non-linear crystal that is disposed on an optical path of the first wavelength-converted light and generates second wavelength-converted light based on the first wavelength-converted light and the second laser beam, a second adjustment unit configured to perform phase matching of the second wavelength-converted light in the second non-linear crystal, a wavelength selection element disposed on an optical path of light output from the second non-linear crystal, a light detection unit configured to detect light having a wavelength selected by passing through the wavelength selection element, and a processor configured to control the first adjustment unit based on intensity of at least one of the first wavelength-converted light and the first laser beam having transmitted through the second non-linear crystal and detected by the light detection unit and to control the second adjustment unit based on intensity of at least one of the second wavelength-converted light detected by the light detection unit and the second laser beam having transmitted through the second non-linear crystal and detected by the light detection unit; outputting the third laser beam to an exposure apparatus; and exposing a photosensitive substrate to the third laser beam in the exposure apparatus to manufacture an electronic device.

BRIEF DESCRIPTION OF THE DRAWINGS

Embodiments of the present disclosure will be described below as mere examples with reference to the accompanying drawings.

FIG. 6 is a flowchart illustrating an example of a converted-light finding routine.

FIG. 7 is a graph illustrating an operation concept of the converted-light finding routine.

FIG. 12 schematically illustrates a configuration of a wavelength conversion system according to Embodiment 4.

FIG. 15 is a flowchart illustrating an example of a main routine of initial alignment applied in Embodiment 5.

FIG. 16 is a graph schematically illustrating the relation between an incident angle on a third CLBO crystal and first sum frequency light (non-converted light) output.

FIG. 17 is a flowchart illustrating an example of a second-sum-frequency-light finding routine based on first-sum-frequency-light output measurement for the third CLBO crystal.

FIG. 18 is a graph illustrating an operation concept of the second-sum-frequency-light finding routine based on the first-sum-frequency-light output measurement.

FIG. 22 is a concept diagram of arithmetic processing of predicting a peak position based on a plurality of measurement results by fitting processing.

DESCRIPTION OF EMBODIMENTS

Contents

1. Overview of solid-state laser system
   1.1 Configuration
   1.2 Operation
2. Problem
3. Embodiment 1
   3.1 Configuration
   3.2 Operation
   3.3 Control example 1 of initial alignment
       3.3.1 Main routine of initial alignment
       3.3.2 Converted-light finding routine
       3.3.3 Converted-light peak-value search routine
   3.4 Effect
4. Embodiment 2
   4.1 Configuration
   4.2 Operation
   4.3 Effect
5. Embodiment 3
   5.1 Configuration
   5.2 Operation
   5.3 Effect
6. Embodiment 4
   6.1 Configuration
   6.2 Operation
   6.3 Effect
7. Embodiment 5
   7.1 Configuration
   7.2 Operation
   7.3 Control example 2 of initial alignment
       7.3.1 Main routine of initial alignment
       7.3.2 Second-sum-frequency-light finding routine
       7.3.3 Non-converted-light bottom-value search routine
   7.4 Effect
   7.5 Modification
8. Embodiment 6
   8.1 Configuration
   8.2 Operation
   8.3 Converted-light peak-value search routine
   8.4 Effect
   8.5 Modification
9. Embodiment 7
   9.1 Configuration
   9.2 Operation
   9.3 Effect
10. Embodiment 8

10.1 Configuration 10.2 Operation 10.3 Effect

11. Phase matching of non-linear crystal

12. Electronic device manufacturing method

13. Other

Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overview of Solid-State Laser System

1.1 Configuration

Figure 1:
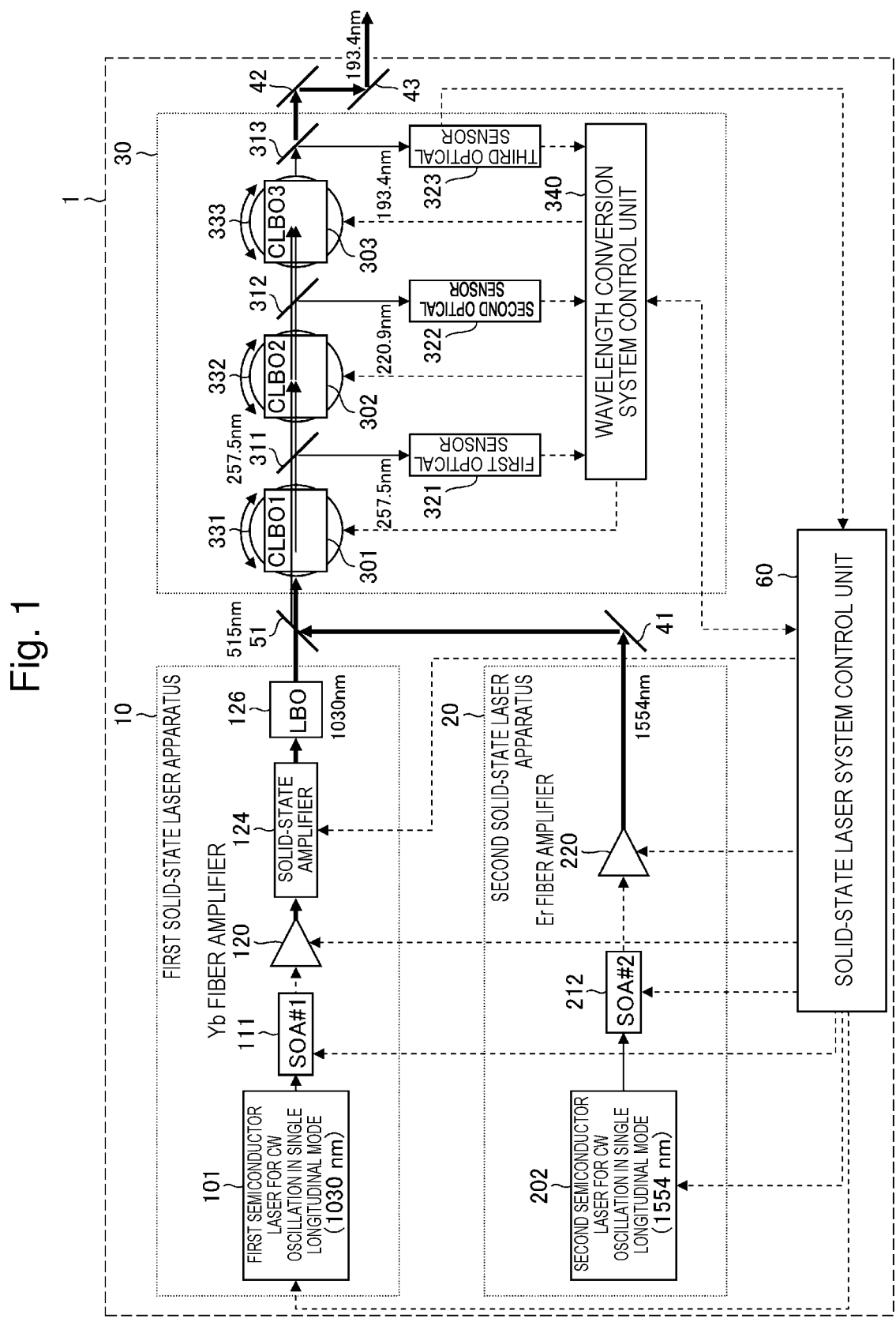
FIG. 1 is a diagram schematically illustrating a configuration of a solid-state laser system.

FIG. 1 is a diagram schematically illustrating a configuration of a solid-state laser system 1. As illustrated in FIG. 1, the solid-state laser system 1 includes a first solid-state laser apparatus 10 configured to output a first pulse laser beam, a second solid-state laser apparatus 20 configured to output a second pulse laser beam, a wavelength conversion system 30, a first high-reflectance mirror 41, a dichroic mirror 51, a second high-reflectance mirror 42, a third high-reflectance mirror 43, and a solid-state laser system control unit 60.

The first high-reflectance mirror 41 highly reflects the second pulse laser beam output from the second solid-state laser apparatus 20. The first high-reflectance mirror 41 is disposed to highly reflect the second pulse laser beam to the dichroic mirror 51.

The dichroic mirror 51 is disposed on an optical path between the first solid-state laser apparatus 10 and the wavelength conversion system 30 such that the optical path of the first pulse laser beam and the optical path of the second pulse laser beam match each other. The dichroic mirror 51 is coated with a film that highly transmits the first pulse laser beam having a wavelength of 515 nm approximately and highly reflects the second pulse laser beam having a wavelength of 1554 nm approximately. The dichroic mirror 51 is disposed such that the first pulse laser beam and the second pulse laser beam are incident on the wavelength conversion system 30 with their optical path axes matched.

The wavelength conversion system 30 is disposed on the optical path of the first pulse laser beam having transmitted through the dichroic mirror 51 and the second pulse laser beam reflected by the dichroic mirror 51 such that the wavelength conversion system 30 outputs a third pulse laser beam based on the first pulse laser beam and the second pulse laser beam.

The second high-reflectance mirror 42 and the third high-reflectance mirror 43 are each constituted by a substrate coated with a film that highly reflects the third pulse laser beam having a wavelength of 193.4 nm approximately and output from the wavelength conversion system 30. The substrate constituting the second high-reflectance mirror 42 and the third high-reflectance mirror 43 may be, for example, quartz or CaF$_2$.

The first solid-state laser apparatus 10 is a laser apparatus configured to output the first pulse laser beam having a wavelength of 515 nm approximately and includes a first semiconductor laser 101, a first semiconductor optical amplifier (SOA) 111, a Yb fiber amplifier 120, a solid-state amplifier 124, and an LBO (LiBp$_3$O$_5$) crystal 126. In FIG. 1 and subsequent drawings, terms denoted by reference numerals, such as "semiconductor laser 1" and "SOA #1", mean the first semiconductor laser and the first semiconductor optical amplifier (SOA), respectively.

The first semiconductor laser 101 is a distributed-feedback (DFB) semiconductor laser configured to perform continuous wave (CW) oscillation of a laser beam in a single longitudinal mode at a wavelength of 1030 nm approximately. A distributed-feedback semiconductor laser is referred to as a "DFB laser". The DFB laser can change the oscillation wavelength by current control and/or temperature control. A CW laser beam output from the first semiconductor laser 101 is referred to as a "first CW laser beam".

The first semiconductor optical amplifier 111 is disposed downstream of the first semiconductor laser 101 and performs pulse amplification of the first CW laser beam as pulse current flows through a semiconductor element. An amplified pulse laser beam output from the first semiconductor optical amplifier 111 is referred to as a "first amplified pulse laser beam".

The Yb fiber amplifier 120 is an optical fiber amplifier disposed downstream of the first semiconductor optical amplifier 111. The Yb fiber amplifier 120 performs further pulse amplification of the first amplified pulse laser beam as excitation light is input to an optical fiber doped with Yb from a non-illustrated CW excitation semiconductor laser. The amplified pulse laser beam output from the Yb fiber amplifier 120 is referred to as a "first fiber amplified pulse laser beam".

The solid-state amplifier 124 is disposed downstream of the Yb fiber amplifier 120. The solid-state amplifier 124 is, for example, an yttrium aluminum garnet (YAG) crystal doped with Yb and performs further pulse amplification of the first fiber amplified pulse laser beam with excitation light from a non-illustrated excitation light source. The amplified pulse laser beam output from the solid-state amplifier 124 is referred to as a "first solid amplified pulse laser beam".

The LBO crystal 126 is a non-linear crystal that is disposed downstream of the solid-state amplifier 124 and generates second harmonic light having a wavelength of 515 nm approximately from the first solid amplified pulse laser beam having a wavelength of 1030 nm approximately. The term "non-linear crystal" is synonymous with "non-linear optical crystal". The first pulse laser beam having a wavelength of 515 nm approximately is output from the LBO crystal 126.

The second solid-state laser apparatus 20 is configured to output the second pulse laser beam having a wavelength of 1554 nm approximately and includes a second semiconductor laser 202, a second semiconductor optical amplifier 212, and an Er fiber amplifier 220.

The second semiconductor laser 202 is a DFB laser configured to perform CW oscillation of a laser beam in the single longitudinal mode at a wavelength of 1554 nm approximately. A CW laser beam output from the second semiconductor laser 202 is referred to as a "second CW laser beam".

The second semiconductor optical amplifier 212 is disposed downstream of the second semiconductor laser 202 and performs pulse amplification of the second CW laser beam as pulse current flows through a semiconductor element. An amplified pulse laser beam output from the second semiconductor optical amplifier 212 is referred to as a "second amplified pulse laser beam".

The Er fiber amplifier 220 is an optical fiber amplifier disposed downstream of the second semiconductor optical amplifier 212. The Er fiber amplifier 220 performs further pulse amplification of the second amplified pulse laser beam as excitation light is input to an optical fiber doped with Er from a non-illustrated CW excitation semiconductor laser. A second pulse laser beam having a wavelength of 1554 nm approximately is output from the Er fiber amplifier 220.

The wavelength conversion system 30 includes a first CLBO ($CsLiB_6O_{10}$) crystal 301 that is a non-linear crystal, a second CLBO crystal 302, a third CLBO crystal 303, a first beam splitter 311, a second beam splitter 312, and a third beam splitter 313. The wavelength conversion system 30 also includes a first optical sensor 321, a second optical sensor 322, a third optical sensor 323, a first rotation stage 331, a second rotation stage 332, a third rotation stage 333, and a wavelength conversion system control unit 340.

The first CLBO crystal 301, the first beam splitter 311, the second CLBO crystal 302, the second beam splitter 312, the third CLBO crystal 303, and the third beam splitter 313 are disposed in the stated order on the laser beam path of the first pulse laser beam and the second pulse laser beam coaxially coupled by the dichroic mirror 51.

The first CLBO crystal 301 is disposed on the first rotation stage 331 to generate the second harmonic light (having a wavelength of 257.5 nm approximately) of light having a wavelength of 515 nm approximately.

The first beam splitter 311 is disposed on an optical path between the first CLBO crystal 301 and the second CLBO crystal 302 such that reflected light from the first beam splitter 311 is incident on the first optical sensor 321.

The first beam splitter 311 is a substrate that highly transmits the second pulse laser beam and the second harmonic light having a wavelength of 257.5 nm approximately and is coated with a film that highly transmits the second pulse laser beam and partially reflects the second harmonic light having a wavelength of 257.5 nm approximately.

The second CLBO crystal 302 is disposed on the second rotation stage 332 to generate first sum frequency light (having a wavelength of 220.9 nm approximately) that is sum frequency light of the first pulse laser beam having a wavelength of 515 nm approximately and the second pulse laser beam.

The second beam splitter 312 is disposed on an optical path between the second CLBO crystal 302 and the third CLBO crystal 303 such that the first sum frequency light reflected from the second beam splitter 312 is incident on the second optical sensor 322.

The second beam splitter 312 is a substrate that highly transmits the second pulse laser beam and highly transmits the first sum frequency light having a wavelength of 220.9 nm approximately and is coated with a film that highly transmits the second pulse laser beam and partially reflects the first sum frequency light having a wavelength of 220.9 nm approximately.

The third CLBO crystal 303 is disposed on the third rotation stage 333 to generate second sum frequency light (having a wavelength of 193.4 nm approximately) that is sum frequency light of the first sum frequency light having a wavelength of 220.9 nm approximately and the second pulse laser beam.

The third beam splitter 313 is disposed on an optical path downstream of the third CLBO crystal 303 such that the reflected second sum frequency light is incident on the third optical sensor 323.

The third beam splitter 313 is a substrate that highly transmits the second sum frequency light having a wavelength of 193.4 nm approximately and is coated with a film that highly transmits the second sum frequency light having a wavelength of 193.4 nm approximately and partially reflects the second sum frequency light having a wavelength of 193.4 nm approximately.

Each of the first optical sensor 321, the second optical sensor 322, and the third optical sensor 323 only needs to be a sensor capable of detecting pulse energy and may be, for example, a photodiode or photoelectric pipe configured to respond at high speed, or a calorie meter configured to measure average power.

When disposed in the atmosphere, a CLBO crystal absorbs water in air and degrades, and thus the first CLBO crystal 301, the second CLBO crystal 302, and the third CLBO crystal 303 are controlled to a temperature of 120° C. approximately in an atmosphere of inert gas (for example, Ar gas) that is unlikely to react with such a CLBO crystal.

Specifically, each of the first CLBO crystal 301, the second CLBO crystal 302, and the third CLBO crystal 303 is fixed to a non-illustrated crystal holder including a heater and a temperature sensor and is disposed in a gas cell purged with the inert gas together with the first beam splitter 311, the second beam splitter 312, or the third beam splitter 313, with the first rotation stage 331, the second rotation stage 332, or the third rotation stage 333, with the first optical sensor 321, the second optical sensor 322, or the third optical sensor 323. The gas cell is called a "CLBO cell box", a "CLBO cell", or simply a "cell" in some cases.

Each of the first rotation stage 331, the second rotation stage 332, and the third rotation stage 333 includes a non-illustrated actuator configured to rotate the stage.

Each of the solid-state laser system control unit 60 and the wavelength conversion system control unit 340 is configured by using a processor. The processor in the present disclosure is a processing device including a storage device in which a control program is stored and a central processing unit (CPU) configured to execute the control program. The processor is specially configured or programmed to execute various kinds of processing included in the present disclosure.

Each of the solid-state laser system control unit 60 and the wavelength conversion system control unit 340 may be configured as a hardware and software combination of one or a plurality of computers. The software is synonymous with a computer program. The computers conceptually include a programmable controller.

A computer may include, for example, a CPU and a storage device. The storage device is a non-transitory computer-readable medium that is a tangible entity and includes, for example, a memory that is a main storage device and a storage that is an auxiliary storage device. The computer-readable medium may be, for example, a semiconductor memory, a hard disk drive (HDD) device, a solid-state drive (SSD) device, or a combination of some of them. A computer program to be executed by the processor is stored in the computer-readable medium.

Some or all of functions of various control devices and processing devices such as the solid-state laser system control unit 60 and the wavelength conversion system control unit 340 may be each configured by using an integrated circuit such as a field programmable gate array (FPGA) or an application specific integrated circuit (ASIC).

1.2 Operation

The solid-state laser system control unit 60 transmits a wavelength conversion preparation signal to the wavelength conversion system control unit 340. Having received the wavelength conversion preparation signal, the wavelength conversion system control unit 340 controls purge of the inert gas and controls the heater of each crystal holder so that the temperature of each of the first CLBO crystal 301, the second CLBO crystal 302, and the third CLBO crystal 303 becomes 120° C. approximately.

The solid-state laser system control unit 60 causes the first semiconductor laser 101 to perform CW oscillation of a laser beam having an oscillation wavelength $\lambda c1$ (1030 nm) and causes the second semiconductor laser 202 to perform CW oscillation of a laser beam having an oscillation wavelength $\lambda c2$ (1554 nm).

When having received a wavelength OK signal from each of the first semiconductor laser 101 and the second semiconductor laser 202, the solid-state laser system control unit 60 sets a trigger timing to each of the first semiconductor optical amplifier 111 and the second semiconductor optical amplifier 212 so that the first pulse laser beam output from the first solid-state laser apparatus 10 and the second pulse laser beam output from the second solid-state laser apparatus 20 are incident at the same timing in the first CLBO crystal 301.

The following specifically describes a case in which a target central wavelength $\lambda ct$ of the solid-state laser system 1 is 193.4 nm, a target central wavelength $\lambda 1ct$ of the first solid-state laser apparatus 10 is 515 nm, and a target central wavelength $\lambda 2ct$ of the second solid-state laser apparatus 20 is 1554 nm.

In the first solid-state laser apparatus 10, a CW oscillation laser beam (the first CW laser beam) having a central wavelength of 1030 nm is output from the first semiconductor laser 101.

The first CW laser beam is subjected to pulse amplification at the first semiconductor optical amplifier 111 to generate the first amplified pulse laser beam.

The first amplified pulse laser beam output from the first semiconductor optical amplifier 111 is amplified by the Yb fiber amplifier 120 and the solid-state amplifier 124 and is incident on the LBO crystal 126.

In the LBO crystal 126, the incident pulse laser beam is subjected to wavelength conversion into the first pulse laser beam that is the second harmonic light (having a wavelength of 515 nm) of light having a wavelength of 1030 nm. The first pulse laser beam obtained through the wavelength conversion at the LBO crystal 126 is incident on the wavelength conversion system 30 through the dichroic mirror 51.

In the second solid-state laser apparatus 20, a CW oscillation laser beam (the second CW laser beam) having a central wavelength of 1554 nm is output from the second semiconductor laser 202.

The second CW laser beam is subjected to pulse amplification at the second semiconductor optical amplifier 212 to generate a pulse laser beam (the second amplified pulse laser beam).

The second amplified pulse laser beam is amplified by the Er fiber amplifier 220 and is output as the second pulse laser beam.

The second pulse laser beam is coupled to the spatially same optical path as the first pulse laser beam through the first high-reflectance mirror 41 and the dichroic mirror 51 and is incident on the wavelength conversion system 30.

The solid-state laser system control unit 60 controls the Yb fiber amplifier 120 and the solid-state amplifier 124 of the first solid-state laser apparatus 10 so that the first pulse laser beam has certain pulse energy.

The solid-state laser system control unit 60 controls the Er fiber amplifier 220 of the second solid-state laser apparatus 20 so that the second pulse laser beam has certain pulse energy.

The solid-state laser system control unit 60 transmits a control command to the wavelength conversion system control unit 340.

In the wavelength conversion system 30, the first pulse laser beam (515 nm) is converted into the second harmonic light through the first CLBO crystal 301 to generate a pulse laser beam having a wavelength of 257.5 nm.

In the first beam splitter 311, part of the pulse laser beam having a wavelength of 257.5 nm is sampled and incident on the first optical sensor 321, and pulse energy of the pulse laser beam having a wavelength of 257.5 nm is detected.

The wavelength conversion system control unit 340 controls the incident angle on the first CLBO crystal 301 by operating the first rotation stage 331 so that a detected value at the first optical sensor 321 is maximized.

Subsequently, the second harmonic light having a wavelength of 257.5 nm and the second pulse laser beam having a wavelength of 1554 nm are incident on the second CLBO crystal 302 through the first beam splitter 311.

In the second CLBO crystal 302, the first sum frequency light having a wavelength of 220.9 nm corresponding to the sum frequency of the second harmonic light having a wavelength of 257.5 nm and the second pulse laser beam having a wavelength of 1554 nm is generated.

In the second beam splitter 312, part of the first sum frequency light having a wavelength 220.9 nm is sampled and incident on the second optical sensor 322, and pulse energy of the first sum frequency light having a wavelength of 220.9 nm is detected.

The wavelength conversion system control unit 340 controls the incident angle on the second CLBO crystal 302 by operating the second rotation stage 332 so that a detected value at the second optical sensor 322 is maximized.

In the third CLBO crystal 303, the second sum frequency light having a wavelength of 193.4 nm corresponding to the sum frequency of the first sum frequency light having a wavelength of 220.9 nm and the second pulse laser beam having a wavelength of 1554 nm is generated.

In the third beam splitter 313, part of the second sum frequency light having a wavelength of 193.4 nm is sample and incident on the third optical sensor 323, and pulse energy of the second sum frequency light having a wavelength of 193.4 nm is detected. The second sum frequency light having transmitted through the third beam splitter 313 is output from the solid-state laser system 1 as the third pulse laser beam.

The wavelength conversion system control unit 340 controls the incident angle on the third CLBO crystal 303 by operating the third rotation stage 333 so that a detected value at the third optical sensor 323 is maximized.

The wavelength conversion system control unit 340 transmits a wavelength conversion system control OK signal to the solid-state laser system control unit 60 when the detected value at each of the first optical sensor 321, the second optical sensor 322, and the third optical sensor 323 is controlled near its maximum value.

2. Problem

Figure 2:
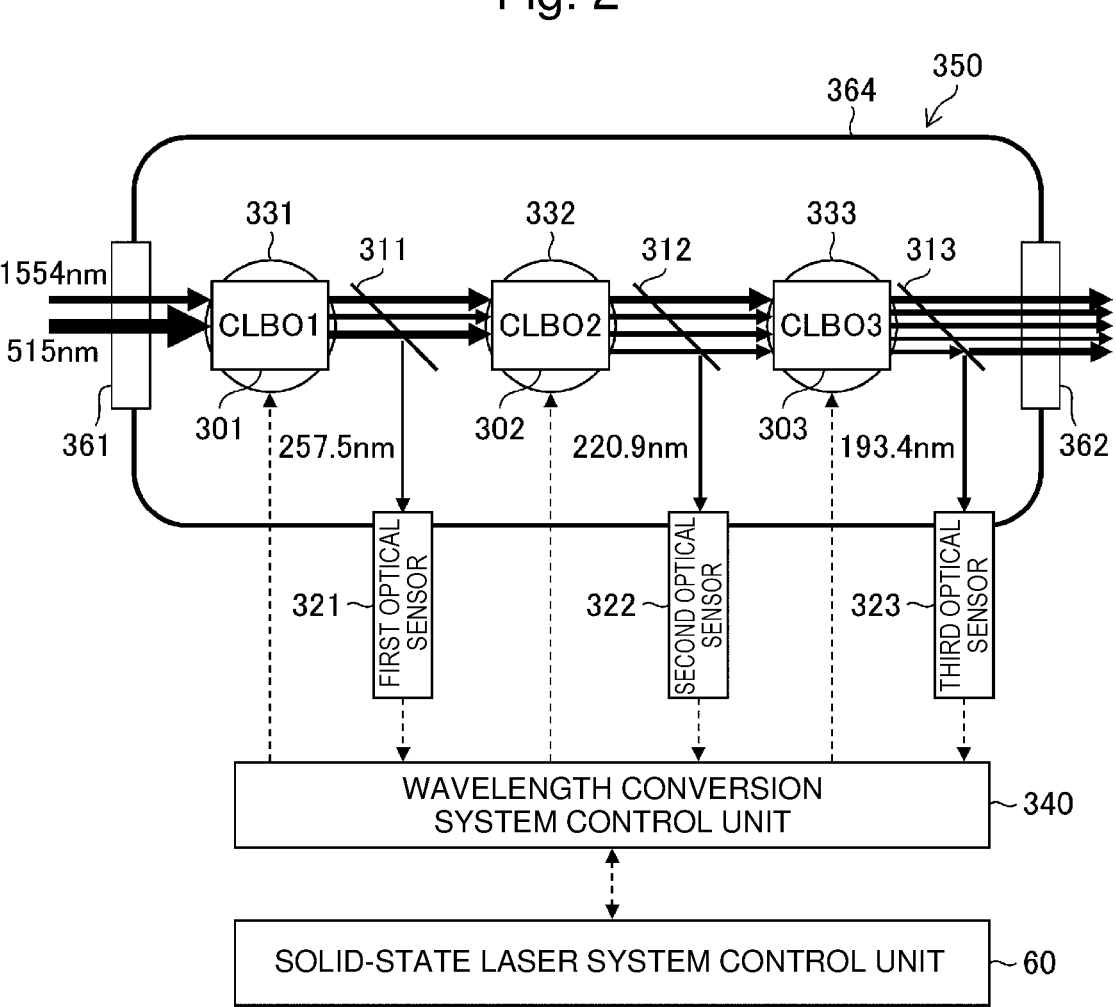
FIG. 2 schematically illustrates an exemplary configuration of a wavelength conversion system according to a comparative example.

FIG. 2 schematically illustrates an exemplary configuration of the wavelength conversion system 30 according to a comparative example. The comparative example of the present disclosure is an example that the applicant recognizes as known only by the applicant, but is not a publicly known example that is recognized by the applicant.

The wavelength conversion system 30 includes a CLBO cell box 350. The CLBO cell box 350 includes a container 364 provided with an entrance window 361 and an emission window 362, and the first CLBO crystal 301, the second CLBO crystal 302, the third CLBO crystal 303, the first beam splitter 311, the second beam splitter 312, the third beam splitter 313, the first rotation stage 331, the second rotation stage 332, the third rotation stage 333, the first optical sensor 321, the second optical sensor 322, and the third optical sensor 323 are housed in the container 364. The first rotation stage 331, the second rotation stage 332, the third rotation stage 333, the first optical sensor 321, the second optical sensor 322, and the third optical sensor 323 may be each partially positioned outside the container 364.

A CLBO crystal has a moisture absorption property and thus needs to be heated to 120° C. approximately inside a cell and to be used while the temperature is maintained.

Thus, the first CLBO crystal 301, the second CLBO crystal 302, and the third CLBO crystal 303 need to be disposed in one cell and the distance between crystals needs to be shortened as much as possible to improve the wavelength conversion efficiency.

Furthermore, the angle of each of the first CLBO crystal 301, the second CLBO crystal 302, and the third CLBO crystal 303 (the incident angle of light on each crystal) needs to be controlled so that wavelength conversion occurs and the conversion efficiency thereof is maximized.

3. Embodiment 1

3.1 Configuration

Figure 3:
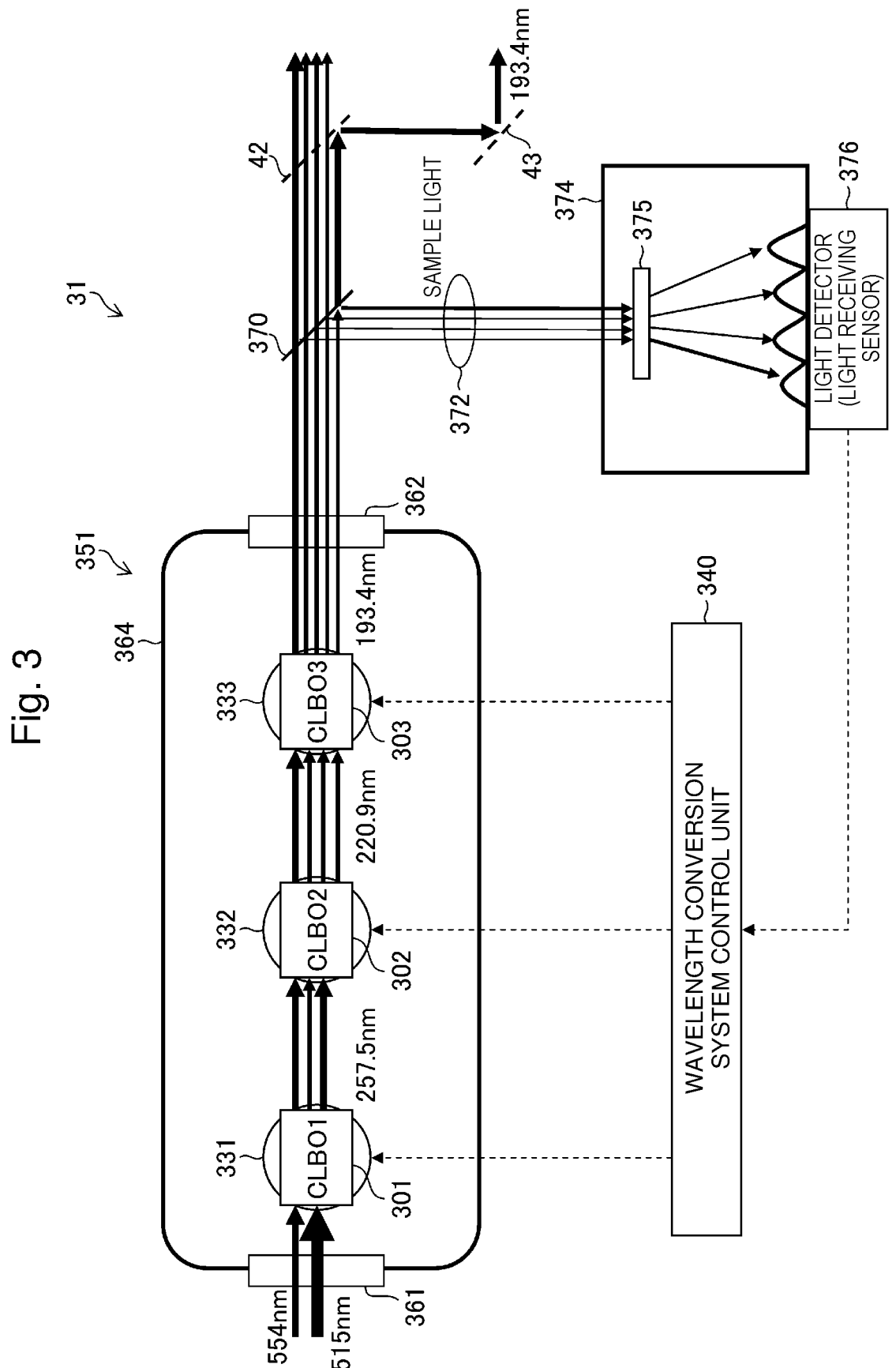
FIG. 3 schematically illustrates a configuration of a wavelength conversion system applied to a solid-state laser system according to Embodiment 1.

FIG. 3 schematically illustrates a configuration of a wavelength conversion system 31 applied to the solid-state laser system 1 according to Embodiment 1. In Embodiment 1, the wavelength conversion system 31 illustrated in FIG. 3 is applied in place of the wavelength conversion system 30 illustrated in FIG. 2. Description will be made on the difference of the configuration illustrated in FIG. 3 from the configuration illustrated in FIG. 2.

The wavelength conversion system 31 includes a CLBO cell box 351 in place of the CLBO cell box 350. The CLBO cell box 351 does not include the first beam splitter 311, the second beam splitter 312, the third beam splitter 313, the first optical sensor 321, the second optical sensor 322, nor the third optical sensor 323 described above with reference to FIG. 2. In the container 364, the first CLBO crystal 301, the second CLBO crystal 302, and the third CLBO crystal 303 are arranged in line in the stated order and the first rotation stage 331, the second rotation stage 332, and the third rotation stage 333 corresponding to the respective crystals are disposed. The inert gas is supplied into the container 364 through a non-illustrated gas supply inlet.

The wavelength conversion system 31 includes a distribution optical element 370, a lens 372, and a wavelength measurement unit 374 in place of the first beam splitter 311, the second beam splitter 312, the third beam splitter 313, the first optical sensor 321, the second optical sensor 322, and the third optical sensor 323 in FIG. 2. The wavelength measurement unit 374 includes a wavelength dispersion element 375 and a light detector 376.

The distribution optical element 370 may be a distribution mirror such as a beam splitter. The distribution optical element 370 may be, for example, a beam sampler splitter or a dichroic mirror.

The wavelength dispersion element 375 may be a grating, a diffracting lattice, or the like for wavelength dispersion or may be a filter or the like.

The light detector 376 includes a light receiving sensor configured to detect light intensity at each wavelength subjected to wavelength dispersion. The light detector 376 may be a combination of a line sensor, a CCD element, or a filter having different sensitivities corresponding to wavelengths and a sensing element.

The first pulse laser beam having a wavelength of 515 nm approximately is an example of a "first laser beam" in the present disclosure. The first solid-state laser apparatus 10 is an example of a "first laser apparatus" in the present disclosure. The second pulse laser beam having a wavelength of 1554 nm approximately is an example of a "second laser beam" in the present disclosure. The second solid-state laser apparatus 20 is an example of a "second laser apparatus" in the present disclosure. The first CLBO crystal 301 is an example of a "first non-linear crystal" in the present disclosure. The first rotation stage 331 is an example of a "first adjustment unit" and a "first angle adjustment mechanism" in the present disclosure. The second CLBO crystal 302 is an example of a "second non-linear crystal" in the present disclosure. The second rotation stage 332 is an example of a "second adjustment unit" and a "second angle adjustment mechanism" in the present disclosure. The third CLBO crystal 303 is an example of a "third non-linear crystal" in the present disclosure. The third rotation stage 333 is an example of a "third adjustment unit" in the present disclosure. The wavelength dispersion element 375 is an example of a "wavelength selection element" in the present disclosure. The light detector 376 is an example of a "light detection unit" in the present disclosure. The line sensor applied to the light detector 376 is an example of "a plurality of light detection elements" in the present disclosure. The wavelength conversion system control unit 340 is an example of a "processor" in the present disclosure. The pulse laser beam having a wavelength of 193.4 nm approximately and output from the wavelength conversion system 31 is an example of a "third laser beam" in the present disclosure.

3.2 Operation

Part of light that is subjected to wavelength conversion at the first CLBO crystal 301, the second CLBO crystal 302, and the third CLBO crystal 303 arranged inside the CLBO cell box 351 and is output through the emission window 362 is distributed by the distribution optical element 370. The operation of the wavelength conversion is as described above with reference to FIG. 1. Sample light distributed by the distribution optical element 370 is incident on the wavelength measurement unit 374 through the lens 372. In the wavelength measurement unit 374, the light is subjected to wavelength dispersion at the wavelength dispersion element 375, and the intensity thereof is measured at each wavelength by using the light detector 376 such as the line sensor.

Measurement of the first pulse laser beam (515 nm) is needed to check the stability of the output of the first pulse laser beam and to check the amount of conversion of the second harmonic light. With measurement of the output of the first pulse laser beam, it is possible to distinguish whether variation that occurs to the output of the second harmonic light is attributable to the first pulse laser beam or the first CLBO crystal 301.

Similarly, the output of the second pulse laser beam (1554 nm) can be measured but does not necessarily need to be detected at the light detector 376 when a result of the measurement is not used. Partially non-converted light transmits through the CLBO cell box 351 and thus can be detected.

To optimize intensity at each wavelength, the wavelength conversion system control unit 340 performs adjustment (alignment) of the first CLBO crystal 301, the second CLBO crystal 302, and the third CLBO crystal 303 by operating the first rotation stage 331, the second rotation stage 332, and the third rotation stage 333 corresponding to the respective CLBO crystals and changing the rotation angles thereof. The wavelength conversion system control unit 340 performs initial adjustment (initial alignment) of the angular position of each crystal by maximizing light output at a wavelength after conversion at the crystal. The output of light having a converted wavelength obtained through wavelength conversion is referred to as "converted wavelength output", and light having the converted wavelength is referred to as "converted light".

3.3 Control Example 1 of Initial Alignment

3.3.1 Main Routine of Initial Alignment

The following describes an exemplary phase matching method applied to the wavelength conversion system 31 according to Embodiment 1. In the initial alignment of the CLBO crystals, the angle of each CLBO crystal is determined based on increase and decrease of the output of relevant generated converted light (the second harmonic light, the first sum frequency light, or the second sum frequency light) and is adjusted to an optimum crystal angle.

Figure 4:
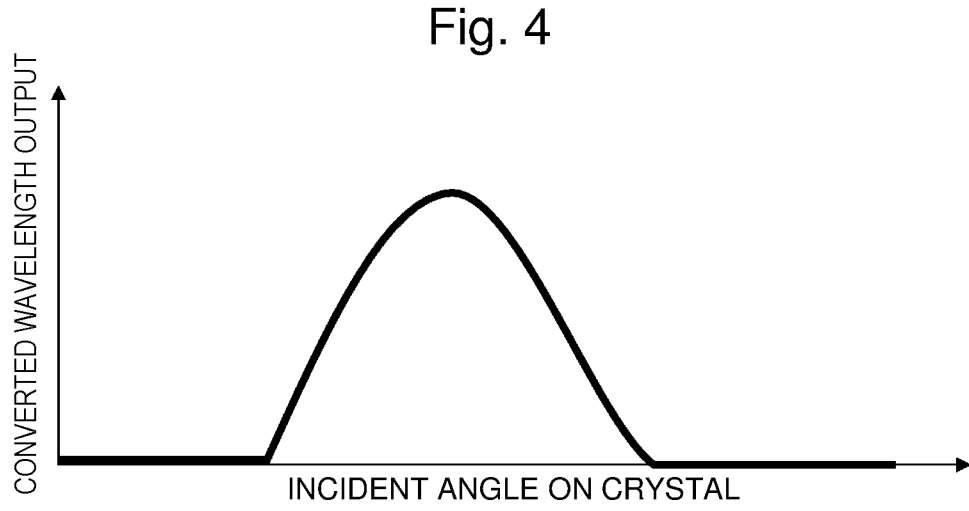
FIG. 4 is a graph illustrating the relation between an incident angle on a non-linear crystal and converted wavelength output.

FIG. 4 is a graph illustrating the relation between the incident angle on a non-linear crystal and the converted wavelength output. As illustrated in FIG. 4, angle adjustment of each CLBO crystal is performed to obtain the incident angle with which the converted wavelength output is maximized.

Angle adjustment of each CLBO crystal is performed in the order of light incidence. Specifically, angle adjustment is first performed on the first CLBO crystal 301. Subsequently, while the first CLBO crystal 301 is adjusted to an appropriate angle, angle adjustment is performed on the second CLBO crystal 302. Lastly, while the first CLBO crystal 301 and the second CLBO crystal 302 are adjusted to appropriate angles, angle adjustment is performed on the third CLBO crystal 303.

Each CLBO crystal is adjusted to an optimum angle by performing a converted-light finding routine that measures intensity at a target wavelength while changing the angle thereof and searches for converted light generation and then by performing a peak-value search routine that searches for the maximum value of the converted wavelength output.

Figure 5:
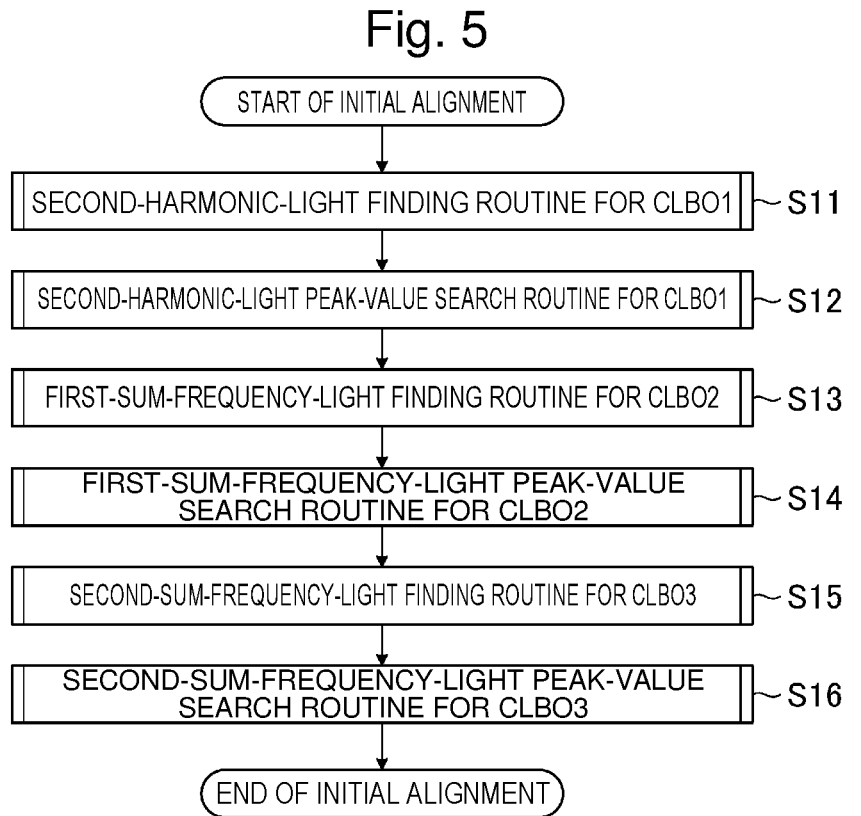
FIG. 5 is a flowchart illustrating an example of a main routine of initial alignment.

FIG. 5 is a flowchart illustrating an example of a main routine of the initial alignment. Processing at each step illustrated in FIG. 5 is achieved as, for example, a processor functioning as the wavelength conversion system control unit 340 executes a command in a computer program.

When the initial alignment is started, the wavelength conversion system control unit 340 performs a second-harmonic-light finding routine for the first CLBO crystal 301 at step S11. In the second-harmonic-light finding routine for the first CLBO crystal 301, an angle change operation is performed on the first CLBO crystal 301 until an angular position at which the light intensity of the second harmonic light (257.5 nm) generated by the first CLBO crystal 301 is equal to or larger than a threshold value is found. The process at step S11 is an example of a "process of finding first wavelength-converted light" in the present disclosure.

When the angular position at which the light intensity of the second harmonic light is equal to or larger than the threshold value is found, the wavelength conversion system control unit 340 proceeds to step S12.

At step S12, the wavelength conversion system control unit 340 performs a second-harmonic-light peak-value search routine for the first CLBO crystal 301. In the second-harmonic-light peak-value search routine for the first CLBO crystal 301, angle adjustment is performed on the first CLBO crystal 301 so that the light intensity of the second harmonic light is maximized.

Subsequently at step S13, the wavelength conversion system control unit 340 performs a first-sum-frequency-light finding routine for the second CLBO crystal 302. In the first-sum-frequency-light finding routine for the second CLBO crystal 302, an angle change operation is performed on the second CLBO crystal 302 until an angular position at which the light intensity of the first sum frequency light (220.9 nm) generated through the second CLBO crystal 302 is equal to or larger than a threshold value is found. The process at step S13 is an example of a "process of finding second wavelength-converted light" in the present disclosure.

When the angular position at which the light intensity of the first sum frequency light is equal to or larger than the threshold value is found, the wavelength conversion system control unit 340 proceeds to step S14.

At step S14, the wavelength conversion system control unit 340 performs a first-sum-frequency-light peak-value search routine for the second CLBO crystal 302. In the first-sum-frequency-light peak-value search routine for the second CLBO crystal 302, angle adjustment is performed on the second CLBO crystal 302 so that the light intensity of the first sum frequency light is maximized.

Subsequently at step S15, the wavelength conversion system control unit 340 performs a second-sum-frequency-light finding routine for the third CLBO crystal 303. In the second-sum-frequency-light finding routine for the third CLBO crystal 303, an angle change operation is performed on the third CLBO crystal 303 until an angular position at which the light intensity of the second sum frequency light (193.4 nm) generated through the third CLBO crystal 303 is equal to or larger than a threshold value is found. When the angular position at which the light intensity of the second sum frequency light is equal to or larger than the threshold value is found, the wavelength conversion system control unit 340 proceeds to step S16.

At step S16, the wavelength conversion system control unit 340 performs a second-sum-frequency-light peak-value search routine for the third CLBO crystal 303. In the second-sum-frequency-light peak-value search routine for the third CLBO crystal 303, angle adjustment is performed on the third CLBO crystal 303 so that the light intensity of the second sum frequency light is maximized. When the processing at step S16 is ended, the wavelength conversion system control unit 340 ends the flowchart in FIG. 5.

3.3.2 Converted-Light Finding Routine

FIG. 6 is a flowchart illustrating an example of the converted-light finding routine. The flowchart illustrated in FIG. 6 is applied to steps S11, S13, and S15 in FIG. 5.

When the converted-light finding routine is started, the wavelength conversion system control unit 340 measures the output of converted light at step S21. The wavelength conversion system control unit 340 acquires light intensity information of a target wavelength from the light detector 376.

Subsequently at step S22, the wavelength conversion system control unit 340 compares the measured value of the output of converted light with a threshold value for determination of wavelength conversion occurrence. When the output measured value is smaller than the threshold value as a result of the comparison at step S22, the wavelength conversion system control unit 340 proceeds to step S23.

At step S23, the wavelength conversion system control unit 340 determines whether the crystal angle has reached a movement range limit. When the determination at step S23 is negative, in other words, when the crystal angle has not reached the movement range limit, the wavelength conversion system control unit 340 proceeds to step S25.

At step S25, the wavelength conversion system control unit 340 changes the angle of the target CLBO crystal and returns to step S21.

When the determination at step S23 is positive, in other words, when the crystal angle has reached the movement range limit, the wavelength conversion system control unit 340 proceeds to step S24.

At step S24, the wavelength conversion system control unit 340 changes a parameter such as the movement range and then proceeds to step S25 and returns to step S21. Steps S21 to S25 are repeated until the measured value of the output of converted light satisfies the threshold value.

When the output measured value is equal to or larger than the threshold value as a result of the comparison at step S22, the wavelength conversion system control unit 340 ends the flowchart in FIG. 6 and returns to the main routine in FIG. 5.

FIG. 7 is a graph illustrating an operation concept of the converted-light finding routine. In FIG. 7, the horizontal axis represents the incident angle on a non-linear crystal and the vertical axis represents the converted wavelength output. The light intensity of converted light after wavelength conversion changes in accordance with a sinc function of the incident angle on the non-linear crystal. However, no output of converted light occurs at an incident angle at which no wavelength conversion occurs as illustrated with the starting point of pattern A and the starting point of pattern B in FIG. 7, and thus the converted-light finding routine needs to be performed to search for an angle at which the output of converted light through wavelength conversion is equal to or larger than a predetermined threshold value.

In the converted-light finding routine, output (intensity) of converted light is measured and comparison is performed to determine whether the output satisfies a threshold value corresponding to an intensity at which it is regarded that a target wavelength is obtained through wavelength conversion. The intensity corresponding to the threshold value needs to be sufficient for proper functioning of a converted-light peak-value search routine performed after the converted-light finding routine.

When the intensity of converted light does not satisfy the threshold value, the crystal angle is changed by a large step in a set movement range limit and the output of converted light is measured, and the angle change movement is repeated until the threshold value is satisfied. When no angle that satisfies the threshold value is found in the movement range limit, a parameter such as the range is changed again and the angle change movement is continued. The change may be manually performed or may be performed by semiautomatic processing with coefficient processing.

It is preferable to perform noise removal in the wavelength conversion system and a measurement system by employing a measured value after elapse of a stabilization time until the output of converted light is stabilized or by employing the average value of measured values obtained by a plurality of times of measurement at a predetermined time interval.

3.3.3 Converted-Light Peak-Value Search Routine

After occurrence of wavelength conversion is checked through the converted-light finding routine, the wavelength conversion system control unit 340 proceeds to the "converted-light peak-value search routine" for maximizing the intensity of converted light at a wavelength.

Figure 8:
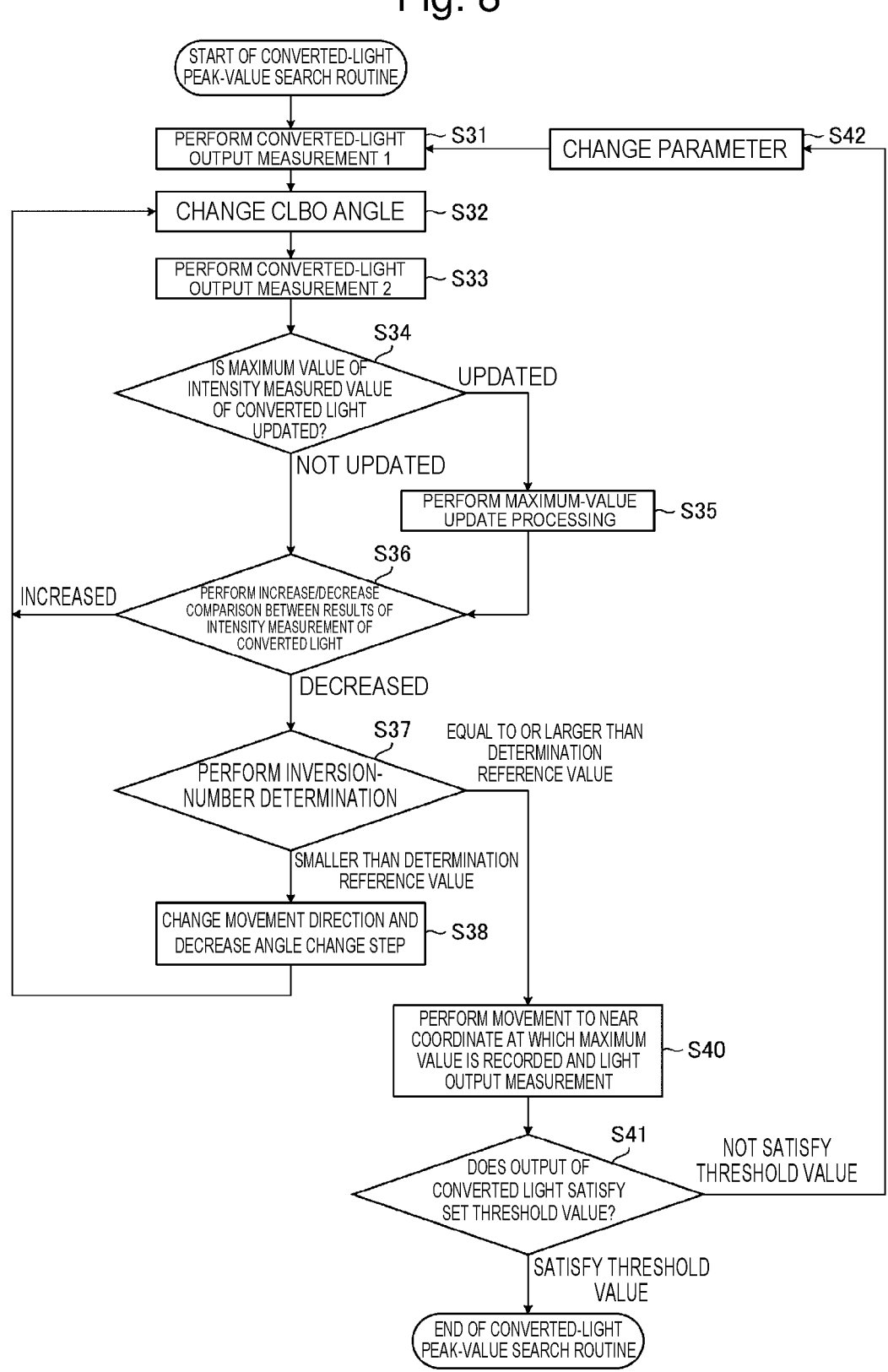
FIG. 8 is a flowchart illustrating an example of a converted-light peak-value search routine.

FIG. 8 is a flowchart illustrating an example of the converted-light peak-value search routine. The flowchart illustrated in FIG. 8 is applied to steps S12, S14, and S16 in FIG. 5.

At step S31, the wavelength conversion system control unit 340 performs a converted-light output measurement 1 (first output measurement process). The light intensity of converted light before angle change (before movement) is measured through the first output measurement process.

Subsequently at step S32, the wavelength conversion system control unit 340 changes the angle of a target CLBO crystal by a predetermined angle change amount.

At step S33, the wavelength conversion system control unit 340 performs a converted-light output measurement 2 (second output measurement process). The light intensity of converted light after angle change (after movement) is measured through the second output measurement process. The process at step S33 is an example of a "process of detecting the first wavelength-converted light", a "process of detecting the second wavelength-converted light", and a "process of detecting the third wavelength-converted light" in the present disclosure. A result of the measurement at step S33 is an example of a "result of the detection of the first wavelength-converted light" and a "result of the detection of the second wavelength-converted light" in the present disclosure.

Subsequently at step S34, the wavelength conversion system control unit 340 determines whether the maximum value of the intensity measured value of converted light is updated. The "maximum value" is a provisional maximum value recorded in a memory of the wavelength conversion system control unit 340 as the largest value among intensity measured values obtained during execution of the converted-light peak-value search routine. At start of the flowchart in FIG. 8, the record of the maximum value is reset, and thereafter, depending on the result of the measurement at step S33, update processing of a value recorded as the maximum value is performed at step S35.

When the intensity measured value exceeds the maximum value as a result of the determination at step S34, the wavelength conversion system control unit 340 proceeds to step S35 to perform the maximum-value update processing and then proceeds to step S36.

When the intensity measured value does not exceed the maximum value as a result of the determination at step S34, the wavelength conversion system control unit 340 proceeds to step S36.

At step S36, the wavelength conversion system control unit 340 performs increase/decrease comparison between the results of intensity measurement of converted light before and after the angle change. When the intensity measured value of converted light has increased through the angle change, the wavelength conversion system control unit 340 returns to step S32 and repeats steps S32 to S36.

When the intensity measured value of converted light has decreased through the angle change as a result of the determination at step S36, the wavelength conversion system control unit 340 proceeds to step S37 and performs inversion-number determination. An inversion number is the number of times that the angle movement direction is changed (inverted). A determination reference value is determined for the inversion number in advance, and the inversion number is compared with the determination reference value. When the inversion number is smaller than the determination reference value, the wavelength conversion system control unit 340 proceeds to step S38.

At step S38, the wavelength conversion system control unit 340 changes the movement direction and decreases the angle change step (angle change amount), and then returns to step S32.

When the inversion number is equal to or larger than the determination reference value as a result of the determination at step S37, the wavelength conversion system control unit 340 proceeds to step S40. At step S40, the wavelength conversion system control unit 340 moves the angle to near a coordinate (angular position) at which the maximum value is recorded, and performs converted-light output measurement. The processes at steps S35 and S40 are examples of a "process of specifying the maximum value of the intensity of the first wavelength-converted light" and a "process specifying the maximum value of the intensity of the second wavelength-converted light" in the present disclosure.

Subsequently at step S41, the wavelength conversion system control unit 340 determines whether the output of converted light satisfies a set threshold value. When comparison of the intensity measured value of converted light with the set threshold value indicates that the intensity measured value is equal to or larger than the set threshold value, it is determined that the output of converted light satisfies the set threshold value. When the output of converted light satisfies the set threshold value, the wavelength conversion system control unit 340 ends the flowchart in FIG. 8 and returns to the main routine in FIG. 5.

When the output of converted light does not satisfy the set threshold value as a result of the determination at step S41, the wavelength conversion system control unit 340 proceeds to step S42 to change any parameter and then returns to step S31 to repeat the converted-light peak-value search routine.

Figure 9:
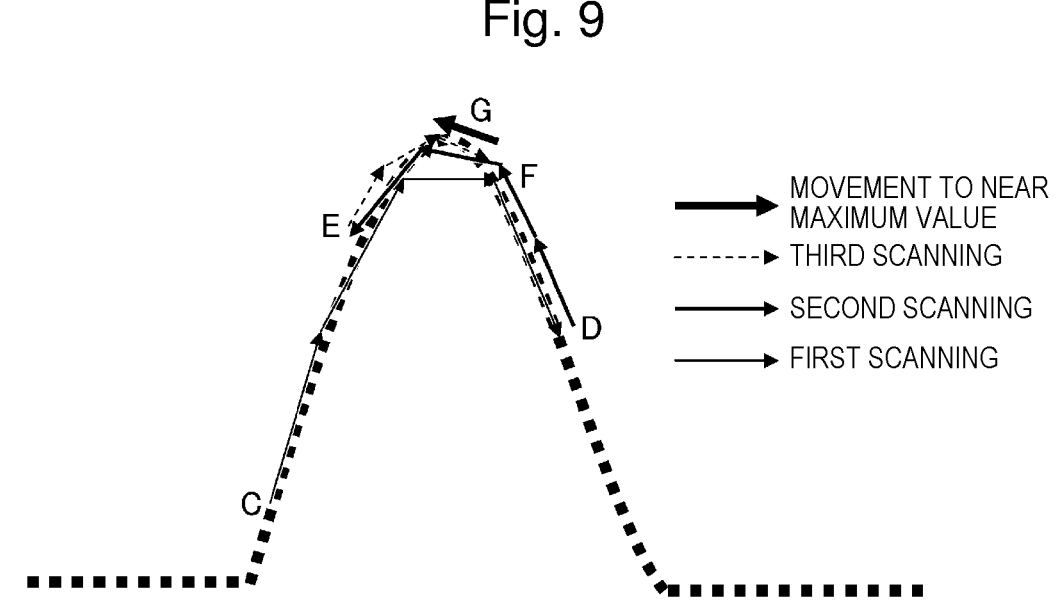
FIG. 9 is a graph illustrating an operation concept of the converted-light peak-value search routine.

FIG. 9 is a graph illustrating an operation concept of the converted-light peak-value search routine. In this example, an inversion operation is allowed up to three times. The horizontal axis represents the incident angle on a crystal and the vertical axis represents the converted wavelength output. In the example illustrated in FIG. 9, the search routine is started at an angular position illustrated as point C, and the angular position is moved to point D through four times of angle change (first scanning). The movement direction is inverted at point D, and the second scanning is performed with a decreased angle change step. In the second scanning, the angular position is moved from point D to point E through four times of angle change. The movement direction is inverted again at point E, and the third scanning is performed with a further decreased angle change step. In the third scanning, the angular position is moved from point E to point F through three times of angle change. Upon arrival at point F, since the allowed upper limit of the inversion number is reached, the fourth scanning is not performed and the angular position is moved from point F to near (point G) the maximum value.

In this manner, the converted-light peak-value search routine performs converted-light output measurement and CLBO-crystal angle change, inverts the movement direction based on a result of determination of whether the intensity at a target wavelength increases or decreases, and repeats scanning a predetermined number of times of inversion while decreasing the angle change interval (angle change amount). In this process, the maximum value and a coordinate (angular position) at which the maximum value is recorded are recorded in association with each other, and after repetitions of angle change, the angular position is moved to near the coordinate at which the maximum value is recorded. When the measured intensity of the output of converted light near the coordinate at which the maximum value is recorded satisfies a set threshold value, adjustment is completed. When the measured intensity does not satisfy the set threshold value, any parameter is changed again and the routine is repeated.

The intensity increase-decrease determination compares the measured intensity before movement and the measured intensity after movement, but the determination is made based on a plurality of measurement results additionally including the measured intensity further before movement in some cases. For example, the comparison may be performed between two points or among multiple points such as three points or more.

3.4 Effect

In the wavelength conversion system 31 according to Embodiment 1, a measurement system for measuring the light intensity of converted light is provided only at the last component in the array of three CLBO crystals, and unlike the comparative example illustrated in FIG. 2, no optical element such as a dichroic mirror is provided between CLBO crystals, which leads to a small light transmission loss. Thus, according to the wavelength conversion system 31 according to Embodiment 1, the wavelength conversion efficiency can be increased as compared to the comparative example illustrated in FIG. 2.

Moreover, according to Embodiment 1, since no optical element needs to be disposed between CLBO crystals, the size of the CLBO cell box 351 in which the first CLBO crystal 301, the second CLBO crystal 302, and the third CLBO crystal 303 are housed can be reduced as compared to the comparative example illustrated in FIG. 2.

4. Embodiment 2

4.1 Configuration

Figure 10:
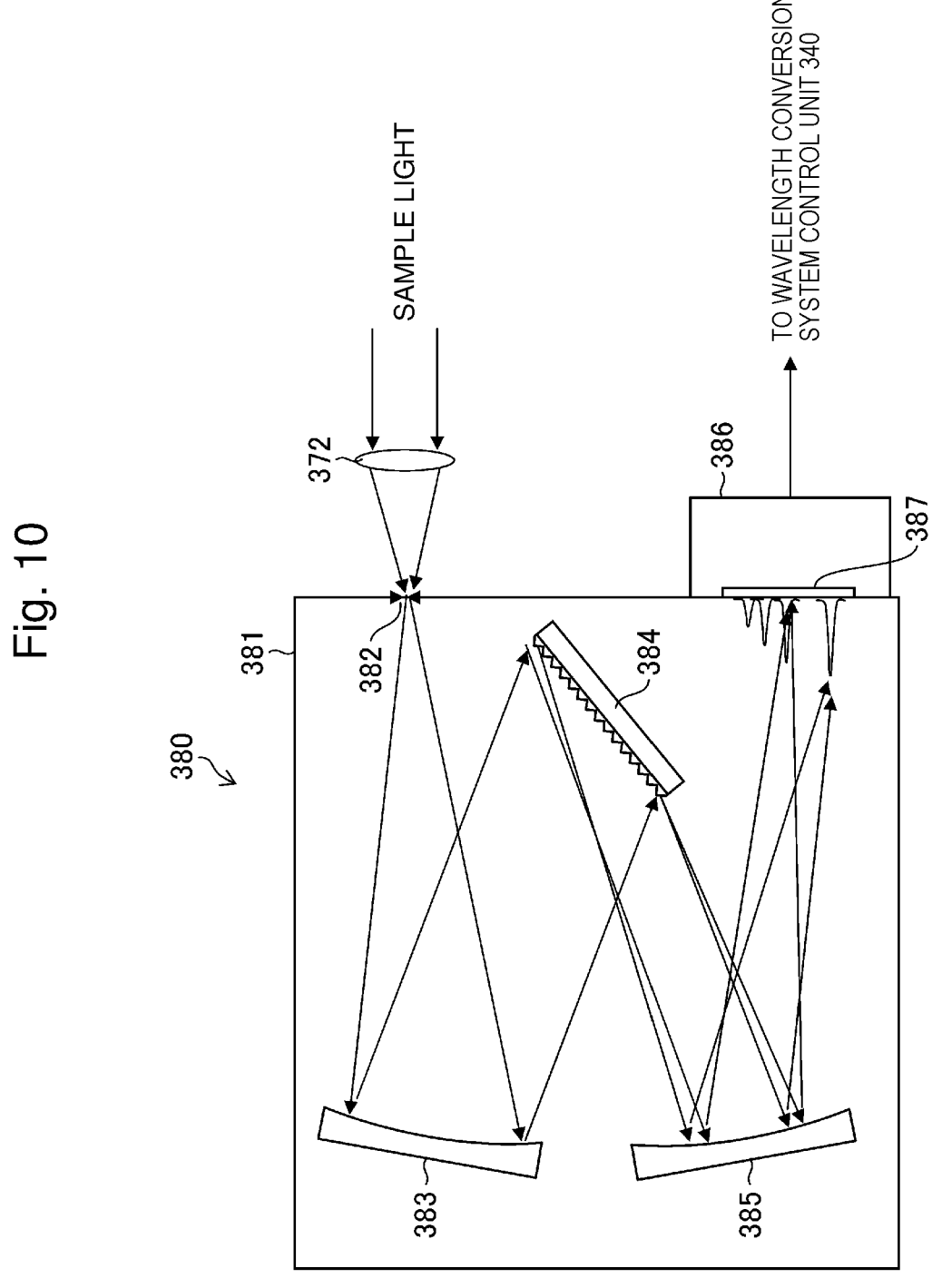
FIG. 10 schematically illustrates a configuration of a wavelength measurement unit applied to a wavelength conversion system according to Embodiment 2.

FIG. 10 schematically illustrates a configuration of a wavelength measurement unit 380 applied to a wavelength conversion system according to Embodiment 2. The wavelength measurement unit 380 illustrated in FIG. 10 may be applied in place of the wavelength measurement unit 374 described above with reference to FIG. 3.

The wavelength measurement unit 380 includes a Czerny-Turner spectrometer 381 and a line sensor 386. The Czerny-Turner spectrometer 381 includes an entrance slit 382, a first concave mirror 383, a grating 384, and a second concave mirror 385. The line sensor 386 includes a photodiode array element 387. A light receiving signal from the line sensor 386 is transferred to the wavelength conversion system control unit 340.

4.2 Operation

Sample light distributed by the distribution optical element 370 (refer to FIG. 3) is condensed through the lens 372, is incident through the entrance slit 382, and is converged by the first concave mirror 383 serving as a collimator mirror. The converged light is incident on the grating 384 and dispersed in a lateral direction at each individual wavelength (color). The dispersed light is imaged onto the line sensor 386 by the second concave mirror 385 serving as a focus mirror. The grating 384 is an example of the "wavelength selection element" in the present disclosure.

4.3 Effect

System establishment of the wavelength measurement unit 380 in Embodiment 2 is more complicate and expensive than that of the wavelength measurement unit 374 in Embodiment 1, but output measured values at a plurality of wavelengths can be acquired all at once. Moreover, with the wavelength measurement unit 380, it is possible to acquire a spectrum shape at each wavelength.

5. Embodiment 3

5.1 Configuration

Figure 11:
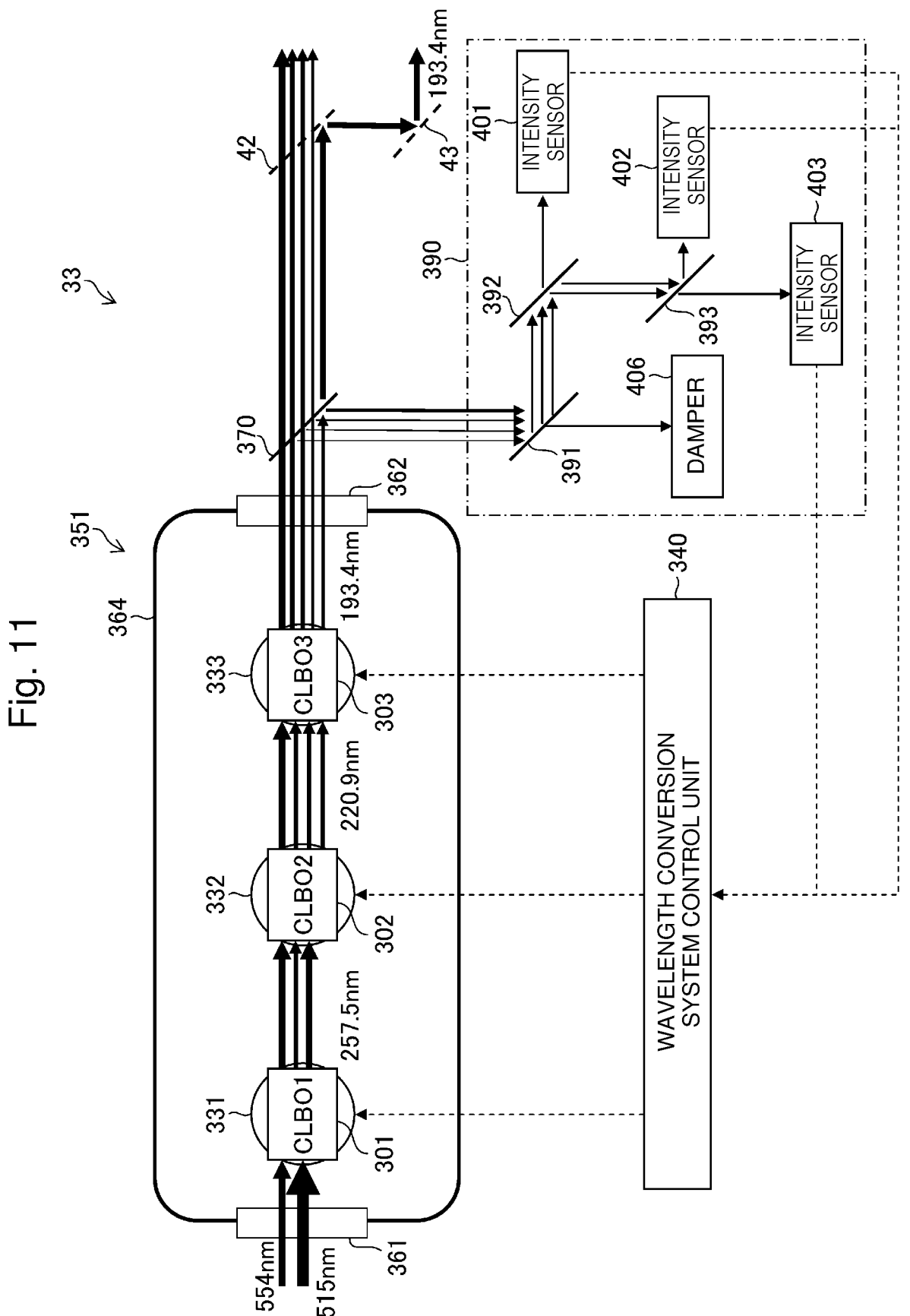
FIG. 11 schematically illustrates a configuration of a wavelength conversion system according to Embodiment 3.

FIG. 11 schematically illustrates a configuration of a wavelength conversion system 33 according to Embodiment 3. In Embodiment 3, the wavelength conversion system 33 illustrated in FIG. 11 is applied in place of the wavelength conversion system 31 illustrated in FIG. 3. Any difference of the configuration illustrated in FIG. 11 from that in FIG. 3 will be described below.

The wavelength conversion system 33 includes a wavelength measurement unit 390 in place of the wavelength measurement unit 374 in FIG. 3. The wavelength measurement unit 390 includes a plurality of dichroic mirrors 391, 392, and 393, a plurality of intensity sensors 401, 402, and 403 configured to detect light intensity, and a damper 406. In other words, the dichroic mirrors 391, 392, and 393 and the intensity sensors 401, 402, and 403 configured to detect light intensity may be used in combination as a measurement system for measuring light intensity at each wavelength. In the wavelength measurement unit 390, light having a wavelength other than a target wavelength is reflected or transmitted at each of the dichroic mirrors 391, 392, and 393, and output of light having the target wavelength is sensed at each of the intensity sensors 401, 402, and 403.

The dichroic mirror 391 is disposed on an optical path between the distribution optical element 370 and the damper 406. The dichroic mirror 391 is coated with a film that highly transmits the first pulse laser beam having a wavelength of 515 nm approximately and highly reflects the second harmonic light having a wavelength of 257.5 nm approximately, the first sum frequency light having a wavelength of 220.9 nm approximately, and the second sum frequency light having a wavelength of 193.4 nm approximately.

The dichroic mirror 392 is disposed on an optical path between the dichroic mirror 391 and the intensity sensor 401. The dichroic mirror 392 is coated with a film that highly transmits the second harmonic light having a wavelength of 257.5 nm approximately and highly reflects the first sum frequency light having a wavelength of 220.9 nm approximately and the second sum frequency light having a wavelength of 193.4 nm approximately.

The dichroic mirror 393 is disposed on an optical path between the dichroic mirror 392 and the intensity sensor 403. The dichroic mirror 393 is coated with a film that highly transmits the first sum frequency light having a wavelength of 220.9 nm approximately and highly reflects the second sum frequency light having a wavelength of 193.4 nm approximately.

The dichroic mirror 393 is disposed such that the second sum frequency light having a wavelength of 193.4 nm approximately and reflected by the dichroic mirror 393 is incident on the intensity sensor 402.

The intensity sensors 401, 402, and 403 are connected to the wavelength conversion system control unit 340. The intensity sensors 401, 402, and 403 are examples of the "light detection unit" in the present disclosure. The dichroic mirrors 391, 392, and 393 are examples of the "wavelength selection element" in the present disclosure.

5.2 Operation

Sample light distributed by the distribution optical element 370 is incident on the dichroic mirror 391. The first pulse laser beam having a wavelength of 515 nm approximately and having transmitted through the dichroic mirror 391 is absorbed by the damper 406. The second harmonic light having a wavelength of 257.5 nm approximately, reflected by the dichroic mirror 391, and having transmitted through the dichroic mirror 392 is incident on the intensity sensor 401. The output of the second harmonic light having a wavelength of 257.5 nm approximately is measured by the intensity sensor 401.

The first sum frequency light having a wavelength of 220.9 nm approximately, reflected by the dichroic mirrors 391 and 392, and having transmitted through the dichroic mirror 393 is incident on the intensity sensor 403. The output of the first sum frequency light having a wavelength of 220.9 nm approximately is measured by the intensity sensor 403.

The second sum frequency light having a wavelength of 193.4 nm approximately and reflected by the dichroic mirrors 391, 392, and 393 is incident on the intensity sensor 402. The output of the second sum frequency light having a wavelength of 193.4 nm approximately is measured by the intensity sensor 402.

Light intensity information detected by each of the intensity sensors 401, 402, and 403 is transferred to the wavelength conversion system control unit 340.

5.3 Effect

The wavelength measurement unit 390 in Embodiment 3 is configured as an integrated combination of the individual intensity sensors 401, 402, and 403 and the dichroic mirrors 391, 392, and 393 and thus can be easily established. Moreover, since light of separated wavelengths is incident on the sensors, wavelength can be highly accurately and easily detected as compared to a case in which light of unseparated wavelengths is incident on one sensor, and thus angle adjustment of each CLBO crystal can be highly accurately and easily performed.

6. Embodiment 4

6.1 Configuration

Figure 12:
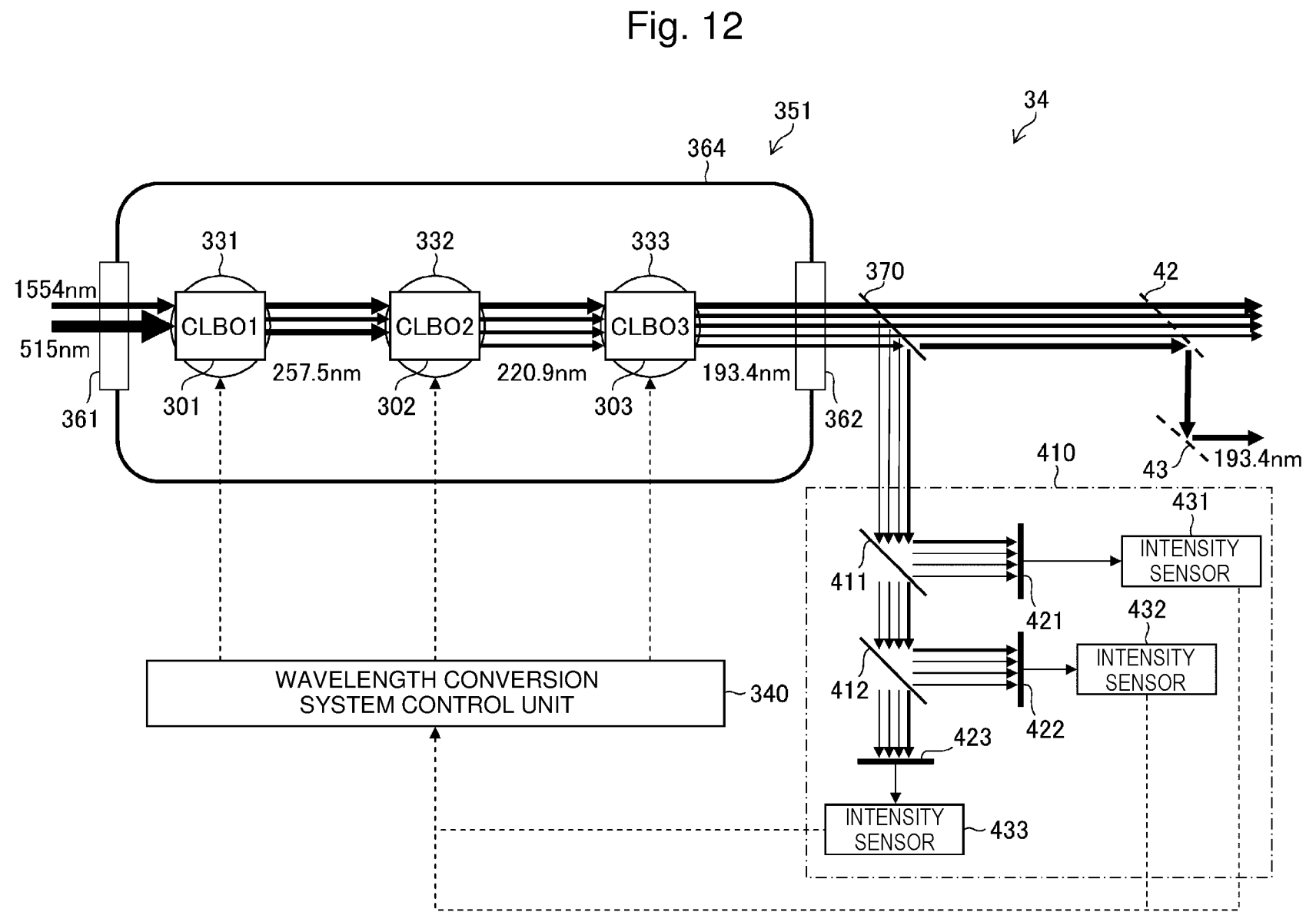

FIG. 12 schematically illustrates a configuration of a wavelength conversion system 34 according to Embodiment 4. In Embodiment 4, the wavelength conversion system 34 illustrated in FIG. 12 is applied in place of the wavelength conversion system 31 illustrated in FIG. 3. Any difference of the configuration illustrated in FIG. 12 from that in FIG. 3 will be described below.

The wavelength conversion system 34 includes a wavelength measurement unit 410 in place of the wavelength measurement unit 374 in FIG. 3. The wavelength measurement unit 410 includes a plurality of distribution optical elements 411 and 412, a plurality of wavelength filters 421, 422, and 423, and a plurality of intensity sensors 431, 432, and 433. In other words, the distribution optical elements 411 and 412 and the wavelength filters 421, 422, and 423 may be used in combination as a measurement system for measuring light intensity at each wavelength.

In the wavelength measurement unit 410, a plurality of mixed wavelength light rays are distributed at the distribution optical elements 411 and 412, light having a wavelength other than a target wavelength is separated at each of the wavelength filters 421, 422, and 423, and output of light having the target wavelength is sensed at the corresponding one of the intensity sensors 431, 432, and 433.

The distribution optical element 411, the distribution optical element 412, and the wavelength filter 423 are disposed in the stated order on an optical path between the distribution optical element 370 and the intensity sensor 433.

The distribution optical element 411 is disposed to reflect part of sample light reflected by the distribution optical element 370 so that the reflected light is incident on the wavelength filter 421.

The wavelength filter 421 is disposed on an optical path between the distribution optical element 411 and the intensity sensor 431. The wavelength filter 421 selectively transmits the second harmonic light having a wavelength of 257.5 nm approximately among incident mixed wavelength light rays. The intensity sensor 431 is disposed to receive the second harmonic light having transmitted through the wavelength filter 421.

The distribution optical element 412 is disposed to reflect some of mixed wavelength light rays having transmitted through the distribution optical element 411 so that the reflected light is incident on the wavelength filter 422.

The wavelength filter 422 is disposed on an optical path between the distribution optical element 412 and the intensity sensor 432. The wavelength filter 422 selectively transmits light having a first sum frequency corresponding to a wavelength of 220.9 nm approximately among incident mixed wavelength light rays. The intensity sensor 432 is disposed to receive the first sum frequency light having transmitted through the wavelength filter 422.

The wavelength filter 423 selectively transmits the second sum frequency light having a wavelength of 193.4 nm approximately among mixed wavelength light rays having transmitted through the distribution optical element 412. The intensity sensor 433 is disposed to receive the second sum frequency light having transmitted through the wavelength filter 423.

The intensity sensors 431, 432, and 433 are connected to the wavelength conversion system control unit 340.

6.2 Operation

Sample light distributed by the distribution optical element 370 is incident on the distribution optical element 411. The sample light reflected by the distribution optical element 411 is incident on the wavelength filter 421. The second harmonic light having a wavelength of 257.5 nm approximately and having transmitted through the wavelength filter 421 is incident on the intensity sensor 431. The output of the second harmonic light having a wavelength of 257.5 nm approximately is measured by the intensity sensor 431.

The sample light having transmitted through the distribution optical element 411 and reflected by the distribution optical element 412 is incident on the wavelength filter 422. The first sum frequency light having a wavelength of 220.9 nm approximately and having transmitted through the wavelength filter 422 is incident on the intensity sensor 432. The output of the first sum frequency light having a wavelength of 220.9 nm approximately is measured by the intensity sensor 432.

The sample light having transmitted through the distribution optical elements 411 and 412 is incident on the wavelength filter 423. The second sum frequency light having a wavelength of 193.4 nm approximately and having transmitted through the wavelength filter 423 is incident on the intensity sensor 433. The output of the second sum frequency light having a wavelength of 193.4 nm approximately is measured by the intensity sensor 433.

Light intensity information detected by each of the intensity sensors 431, 432, and 433 is transferred to the wavelength conversion system control unit 340.

6.3 Effect

The wavelength measurement unit 410 in Embodiment 4 is configured as an integrated combination of the individual intensity sensors 431, 432, and 433 and the wavelength filters 421, 422, and 423 and thus the system can be easily established. Moreover, since light of separated wavelengths is incident on the sensors, wavelength can be highly accurately and easily detected as compared to a case in which light of unseparated wavelengths is incident on one sensor, and thus angle adjustment of each CLBO crystal can be highly accurately and easily performed.

7. Embodiment 5

7.1 Configuration

Figure 13:
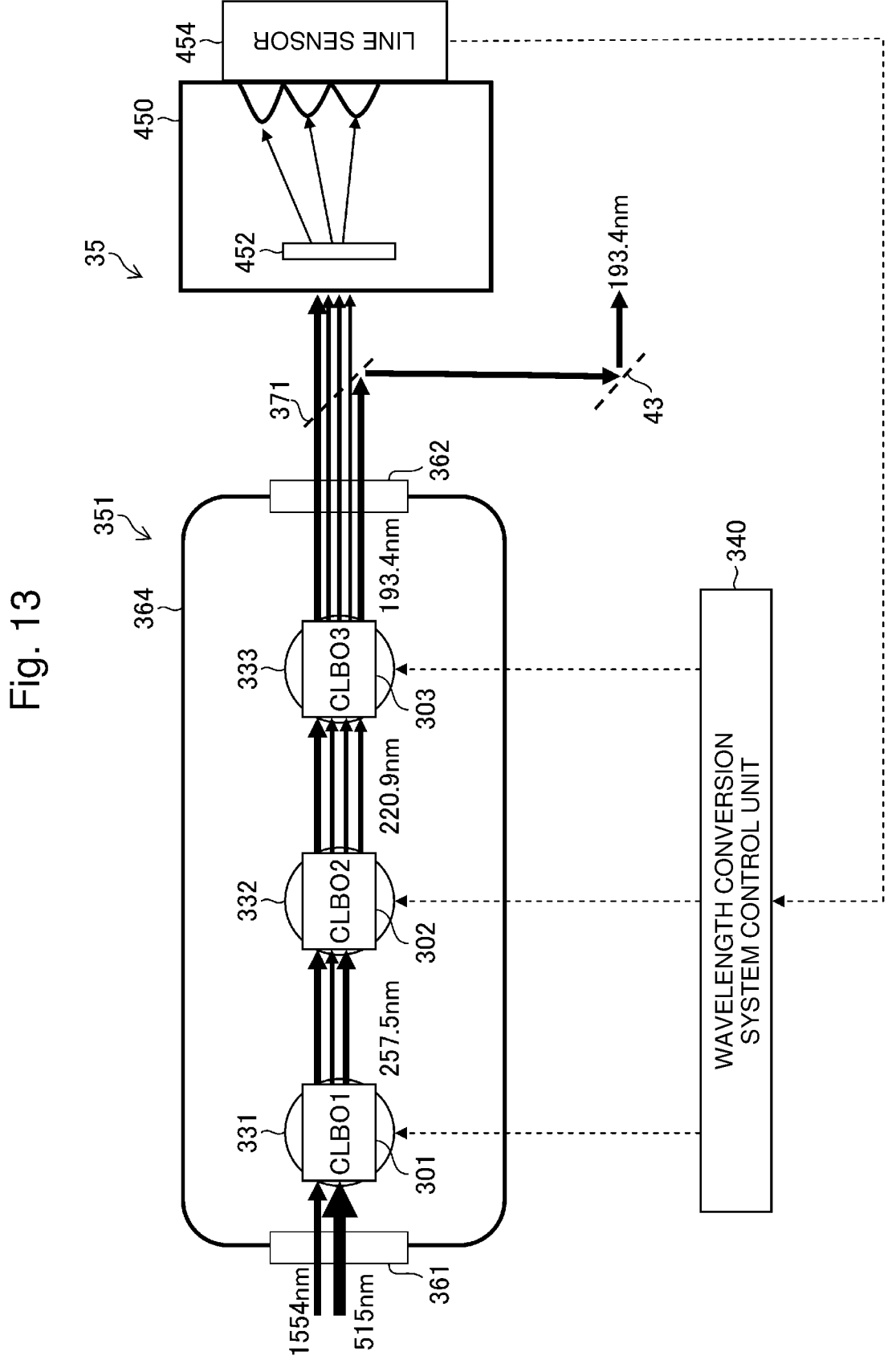
FIG. 13 schematically illustrates a configuration of a wavelength conversion system according to Embodiment 5.

FIG. 13 schematically illustrates a configuration of a wavelength conversion system 35 according to Embodiment 5. Any difference of the configuration illustrated in FIG. 13 from that in FIG. 3 will be described below. In the examples described in Embodiments 1 to 4, the intensity of converted light is measured and the angle of each CLBO crystal is adjusted based on the measured intensity of converted light, but the present invention is not limited to such a configuration, and the intensity of non-converted light may be measured and the angle of each CLBO crystal may be adjusted based on the measured intensity of non-converted light.

The wavelength conversion system 35 according to Embodiment 5 includes a dichroic mirror 371 in place of the distribution optical element 370 in FIG. 3. To minimize a loss of the second sum frequency light (having a wavelength of 193.4 nm approximately), the dichroic mirror 371 only transmits light having a wavelength other than the wavelength of the second sum frequency light, and the angle of the third CLBO crystal 303 is adjusted by using the intensity ratio of the non-converted first sum frequency light (having a wavelength of 220.9 nm approximately) in the transmitted light.

In the example illustrated in FIG. 13, the dichroic mirror 371 only transmits light having a wavelength other than the wavelength of the second sum frequency light, but instead, the dichroic mirror 371 may only reflect light having a wavelength other than the wavelength of the second sum frequency light.

The dichroic mirror 371 illustrated in FIG. 13 is coated with a film that highly reflects the second sum frequency light (having a wavelength of 193.4 nm approximately) and highly transmits light having other wavelengths. The third high-reflectance mirror 43 in the wavelength conversion system 35 is disposed to reflect the second sum frequency light reflected by the dichroic mirror 371.

The wavelength conversion system 35 includes a wavelength measurement unit 450 in place of the wavelength measurement unit 374 in FIG. 3. The wavelength measurement unit 450 includes a wavelength dispersion element 452 and a line sensor 454 and is disposed such that light having transmitted through the dichroic mirror 371 is incident on the wavelength dispersion element 452.

7.2 Operation

Light having transmitted through the dichroic mirror 371 is incident on the wavelength dispersion element 452 of the wavelength measurement unit 450. In the wavelength measurement unit 450, the light is subjected to wavelength dispersion at the wavelength dispersion element 452 and the intensity thereof at each wavelength is measured by using the line sensor 454.

Similarly to Embodiment 1, the intensities of the first pulse laser beam (having a wavelength of 515 nm approximately), the second harmonic light (having a wavelength of 257.5 nm approximately), and the first sum frequency light (having a wavelength of 220.9 nm approximately) at each wavelength are measured by using the line sensor 454, and angle adjustment operation of the first CLBO crystal 301 and the second CLBO crystal 302 is the same as in Embodiment 1.

In the wavelength conversion system 35, the intensity of non-converted light of the first sum frequency light is used to adjust the angle of the third CLBO crystal 303.

Figure 14:
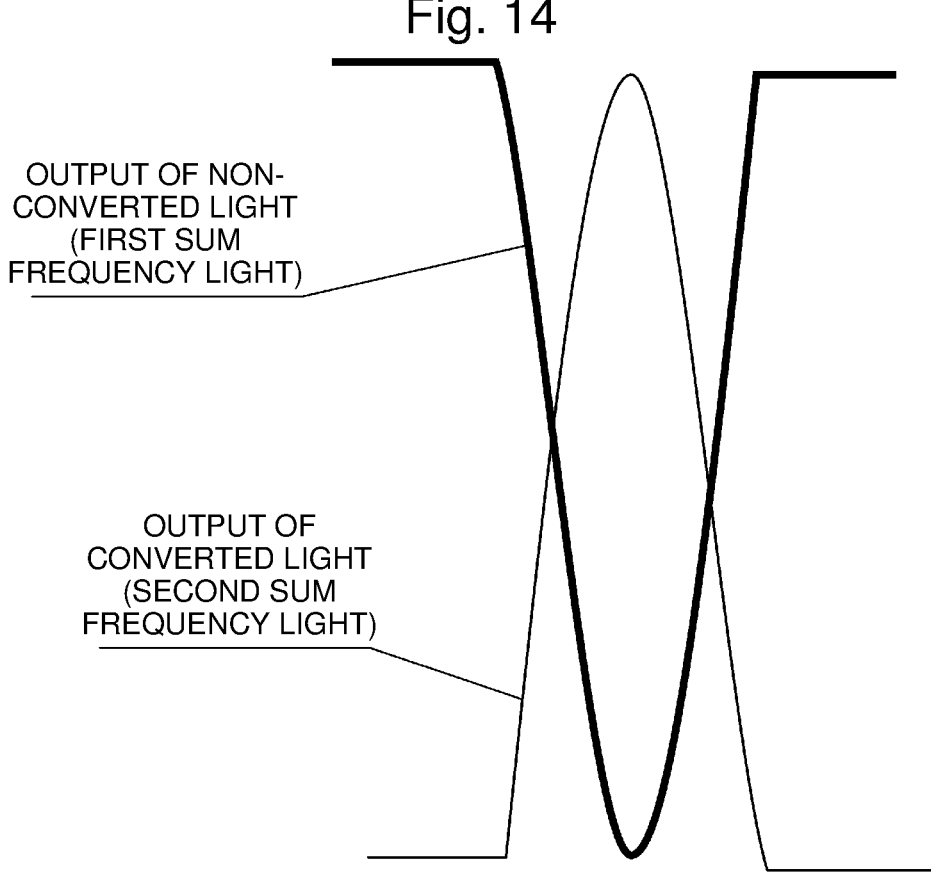
FIG. 14 is a graph schematically illustrating the relation between non-converted light output and converted light output.

FIG. 14 is a graph schematically illustrating the relation between non-converted light output and converted light output. In FIG. 14, the horizontal axis represents the incident angle on a CLBO crystal and the vertical axis represents the light output intensity. When converted light at the CLBO crystal increases, the output of non-converted light decreases accordingly. Thus, when the output of converted light cannot be referred to due to a measurement optical path, a loss, or sensitivity, it is possible to adjust the angle of the CLBO crystal by referring to the intensity and behavior of non-converted light.

For example, in Embodiment 5, the output of the second sum frequency light having a wavelength of 193.4 nm approximately cannot be directly measured, and thus angle adjustment of the first CLBO crystal 301 and the second CLBO crystal 302 maximizes converted light by measuring the output of converted light. The angle adjustment of the third CLBO crystal 303 is performed to minimize the output of the first sum frequency light having a wavelength of 220.9 nm approximately (the output of non-converted light).

In this case, the logical value of determination and the like in the finding routine and the peak-value search routine of the wavelength-converted light is inverted.

7.3 Control Example 2 of Initial Alignment

7.3.1 Main Routine of Initial Alignment

FIG. 15 is a flowchart illustrating an example of the main routine of the initial alignment applied in Embodiment 5. Any difference of the flowchart illustrated in FIG. 15 from the flowchart in FIG. 5 will be described below.

The flowchart illustrated in FIG. 15 includes steps S17 and S18 in place of steps S15 and S16 in FIG. 5. Specifically, alignment (steps S11 to S14) up to the second CLBO crystal 302 is the same as in Embodiment 1. Alignment of the third CLBO crystal 303 will be described below. The third CLBO crystal 303 is aligned based on the intensity of the first sum frequency light as non-converted light.

At step S17 after step S14, the wavelength conversion system control unit 340 performs a second-sum-frequency-light finding routine based on first-sum-frequency-light output measurement for the third CLBO crystal 303. The wavelength conversion system control unit 340 adjusts the third CLBO crystal 303 until the intensity of the first sum frequency light (non-converted light) becomes equal to or smaller than a threshold value. When the intensity of the first sum frequency light as non-converted light is equal to or smaller than the threshold value, the intensity of the second sum frequency light as converted light is equal to or larger than a threshold value. The threshold value for determining the intensity of the first sum frequency light is determined in a relation with the threshold value for determining the intensity of the second sum frequency light. The process at step S17 is an example of a "process of detecting the second wavelength-converted light having passed through the third non-linear crystal" in the present disclosure.

When the intensity of the first sum frequency light has become equal to or smaller than the threshold value, the wavelength conversion system control unit 340 performs a bottom-value search routine for the first sum frequency light output from the third CLBO crystal 303 at step S18. The wavelength conversion system control unit 340 adjusts the third CLBO crystal 303 until the bottom value of the intensity of the first sum frequency light is detected.

After step S18, the wavelength conversion system control unit 340 ends the flowchart in FIG. 15.

The bottom-value search routine may be applied for the first pulse laser beam (having a wavelength of 515 nm approximately) and the second harmonic light (having a wavelength of 257.5 nm approximately) at the first CLBO crystal 301 and the second CLBO crystal 302.

FIG. 16 is a graph schematically illustrating the relation between the incident angle on the third CLBO crystal 303 and the output of the first sum frequency light (non-converted light). As illustrated in FIG. 16, angle adjustment of the third CLBO crystal 303 is performed to minimize the output of the first sum frequency light (non-converted light).

7.3.2 Second-Sum-Frequency-Light Finding Routine

FIG. 17 is a flowchart illustrating an example of the second-sum-frequency-light finding routine based on first-sum-frequency-light output measurement for the third CLBO crystal 303. The flowchart illustrated in FIG. 17 is applied to step S17 in FIG. 15.

When the second-sum-frequency-light finding routine based on first-sum-frequency-light output measurement for the third CLBO crystal 303 is started, the wavelength conversion system control unit 340 measures the output of the first sum frequency light (non-converted light) at step S51. The wavelength conversion system control unit 340 acquires light intensity information of a target wavelength (having a wavelength of 220.9 nm approximately) from the line sensor 454.

Subsequently at step S52, the wavelength conversion system control unit 340 compares the measured value of the output of non-converted light with a threshold value for determination of wavelength conversion occurrence. When the output measured value exceeds the threshold value as a result of the comparison at step S22, the wavelength conversion system control unit 340 proceeds to step S53.

At step S53, the wavelength conversion system control unit 340 determines whether the crystal angle has reached a movement range limit. When the determination at step S53 is negative, in other words, when the crystal angle has not reached the movement range limit, the wavelength conversion system control unit 340 proceeds to step S55.

At step S55, the wavelength conversion system control unit 340 changes the angle of the third CLBO crystal 303 and returns to step S51.

When the determination at step S53 is positive, in other words, when the crystal angle has reached the movement range limit, the wavelength conversion system control unit 340 proceeds to step S54.

At step S54, the wavelength conversion system control unit 340 changes a parameter such as the movement range and then proceeds to step S55 and returns to step S51 thereafter. Steps S51 to S55 are repeated until the measured value of the output of non-converted light becomes equal to or smaller than the threshold value.

When the output measured value is equal to or smaller than the threshold value as a result of the comparison at step S52, the wavelength conversion system control unit 340 ends the flowchart in FIG. 17 and returns to the main routine in FIG. 15.

FIG. 18 is a graph illustrating an operation concept of the second-sum-frequency-light finding routine based on first-sum-frequency-light output measurement. In FIG. 18, the horizontal axis represents the incident angle on a non-linear crystal and the vertical axis represents the intensity of the first sum frequency light (non-converted light).

Wavelength conversion does not occur at the third CLBO crystal 303 in initial disposition, and accordingly, the first sum frequency light is output from the third CLBO crystal 303 without being consumed. By exploiting this characteristic, whether wavelength conversion has occurred is determined by measuring the output intensity of the first sum frequency light while adjusting the third CLBO crystal 303.

No output of converted light occurs at an incident angle at which no wavelength conversion occurs as illustrated with the starting point of pattern A and the starting point of pattern B in FIG. 18, and thus the second-sum-frequency-light finding routine is performed to search for an angle at which the output of non-converted light is equal to or smaller than a predetermined threshold value.

In the second-sum-frequency-light finding routine based on intensity measurement of non-converted light, the light intensity (output) of non-converted light is measured and comparison is performed to determine whether the light intensity satisfies a threshold value corresponding to a light intensity at which it is regarded that light having a target wavelength is generated through wavelength conversion.

When the light intensity of non-converted light is larger than the threshold value, the crystal angle is changed by a large step in a set movement range limit and the output of non-converted light is measured, and the angle change movement is repeated until the light intensity becomes equal to or smaller than the threshold value. When no angle that satisfies the threshold value is found in the movement range limit, a parameter such as the range is changed and the angle change movement is continued.

Then, when the output of non-converted light (the first sum frequency light) becomes equal to or smaller than the threshold value, it is assumed that wavelength conversion has occurred and the second sum frequency light is output, and the wavelength conversion system control unit 340 proceeds to the next step (first-sum-frequency-light bottom-value search routine).

7.3.3 Non-Converted-Light Bottom-Value Search Routine

After the occurrence of wavelength conversion is confirmed by the second-sum-frequency-light finding routine, the wavelength conversion system control unit 340 proceeds to a first-sum-frequency-light (non-converted-light) bottom-value search routine for minimizing the intensity of the first sum frequency light (non-converted light).

Figure 19:
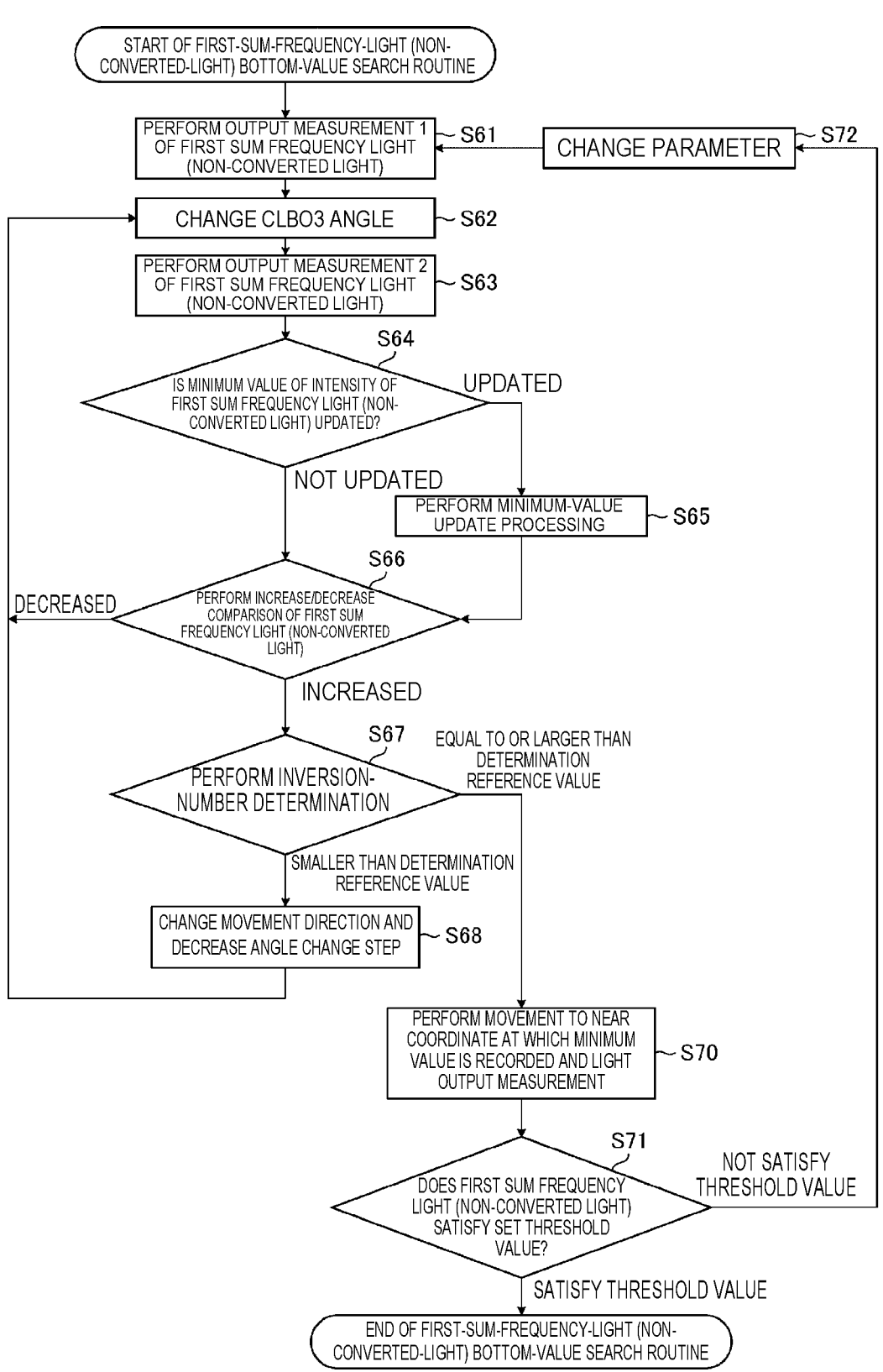
FIG. 19 is a flowchart illustrating an example of a first-sum-frequency-light (non-converted-light) bottom-value search routine.

FIG. 19 is a flowchart illustrating an example of the first-sum-frequency-light (non-converted-light) bottom-value search routine. The flowchart illustrated in FIG. 19 is applied to step S18 in FIG. 15.

At step S61, the wavelength conversion system control unit 340 performs output measurement 1 (first output measurement process) of the first sum frequency light as non-converted light. The light intensity of non-converted light before angle change (before movement) is measured through the first output measurement process.

Subsequently at step S62, the wavelength conversion system control unit 340 changes the angle of the third CLBO crystal 303 by a predetermined angle change amount.

At step S63, the wavelength conversion system control unit 340 performs output measurement 2 (second output measurement) of the first sum frequency light. The light intensity of non-converted light after angle change (after movement) is measured through the second output measurement.

Subsequently at step S64, the wavelength conversion system control unit 340 determines whether the minimum value of the intensity measured value of non-converted light is updated. The "minimum value" is a provisional minimum value recorded in the memory of the wavelength conversion system control unit 340 as the smallest value among intensity measured values obtained during execution of the non-converted-light bottom-value search routine. The "minimum value" is synonymous with a bottom value. At start of the flowchart in FIG. 19, the record of the minimum value is reset, and thereafter, depending on a result of the measurement at step S63, update processing of a value recorded as the minimum value is performed at step S65.

When the intensity measured value is smaller than the minimum value as a result of the determination at step S64, the wavelength conversion system control unit 340 proceeds to step S65 to perform the minimum-value update processing and then proceeds to step S66.

When the intensity measured value is not smaller than the minimum value as a result of the determination at step S64, the wavelength conversion system control unit 340 proceeds to step S66.

At step S66, the wavelength conversion system control unit 340 performs increase/decrease comparison between the results of intensity measurement of non-converted light before and after the angle change. When the intensity measured value of non-converted light has decreased through the angle change, the wavelength conversion system control unit 340 returns to step S62 and repeats steps S62 to S66.

When the intensity measured value of non-converted light has increased through the angle change as a result of the determination at step S66, the wavelength conversion system control unit 340 proceeds to step S67 and performs inversion-number determination. When the inversion number is smaller than a determination reference value as a result of the determination at step S67, the wavelength conversion system control unit 340 proceeds to step S68.

At step S68, the wavelength conversion system control unit 340 changes the movement direction and decreases the angle change step (angle change amount), and then returns to step S62.

When the inversion number is equal to or larger than the determination reference value as a result of the determination at step S67, the wavelength conversion system control unit 340 proceeds to step S70. At step S70, the wavelength conversion system control unit 340 moves the angle to near a coordinate (angular position) at which the minimum value is recorded, and performs non-converted-light output measurement.

Subsequently at step S71, the wavelength conversion system control unit 340 determines whether the output of non-converted light satisfies a set threshold value. When comparison of the intensity measured value of non-converted light with the set threshold value indicates that the intensity measured value is equal to or smaller than the set threshold value, it is determined that the output of non-converted light satisfies the set threshold value. When the output of non-converted light satisfies the set threshold value, the wavelength conversion system control unit 340 ends the flowchart in FIG. 19 and returns to the main routine in FIG. 15.

When the output of non-converted light does not satisfy the set threshold value as a result of the determination at step S71, the wavelength conversion system control unit 340 proceeds to step S72 to change any parameter and then returns to step S61 to repeat the non-converted-light bottom-value search routine.

Figure 20:
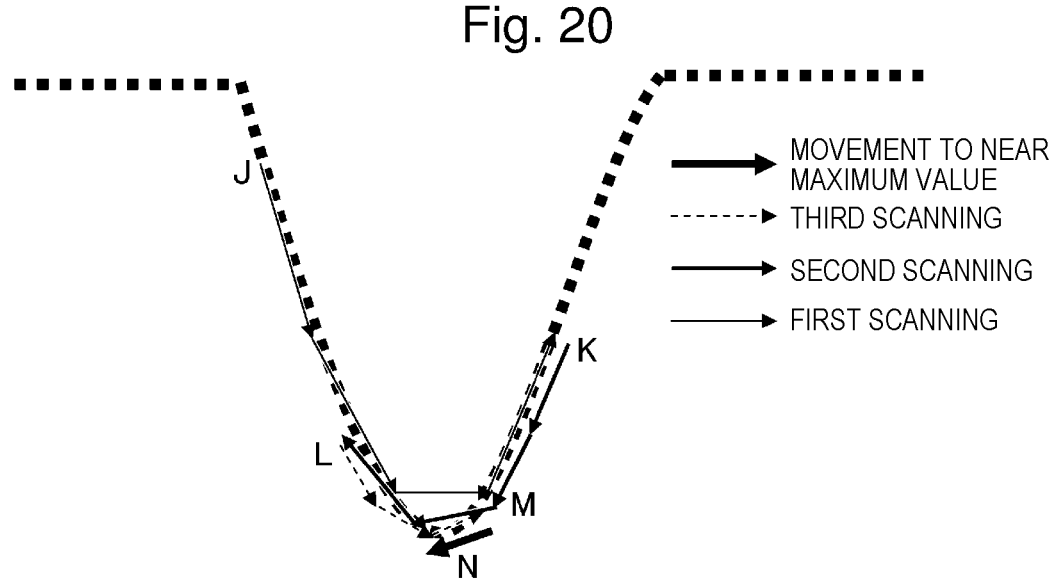
FIG. 20 is a graph illustrating an operation concept of the non-converted-light bottom-value search routine.

FIG. 20 is a graph illustrating an operation concept of the non-converted-light bottom-value search routine. In this example, an inversion operation is allowed up to three times. The horizontal axis represents the incident angle on a crystal and the vertical axis represents the converted wavelength output. In the example illustrated in FIG. 20, the search routine is started at an angular position illustrated as point J, and the angular position is moved to point K through four times of angle change (first scanning). The movement direction is inverted at point K, and the second scanning is performed with a decreased angle change step. In the second scanning, the angular position is moved from point K to point L through four times of angle change. The movement direction is inverted again at point L, and the third scanning is performed with a further decreased angle change step. In the third scanning, the angular position is moved from point L to point M through three times of angle change. Upon arrival at point M, since the allowed upper limit of the inversion number is reached, the fourth scanning is not performed and the angular position is moved from point M to near (point N) the minimum value.

In this manner, the non-converted-light bottom-value search routine performs output measurement of the first sum frequency light and angle change of the third CLBO crystal 303, inverts the movement direction based on determination of whether the output intensity of the first sum frequency light increases or decreases, and repeats scanning a predetermined number of times of inversion while decreasing the angle change interval (angle change amount). In this process, a bottom value and a coordinate (angular position) at which the bottom value is recorded are recorded in association with each other, and after repetitions of angle change, the angle is moved to near the coordinate at which the bottom value is recorded. When the output intensity of non-converted light near the coordinate at which the bottom value is recorded satisfies a set threshold value, adjustment is completed. When the output intensity does not satisfy the set threshold value, any parameter is changed again and the routine is repeated. The bottom value (minimum value) in Embodiment 5 is an example of "lowest intensity of the second wavelength-converted light" in the present disclosure.

The intensity increase-decrease determination compares the measured intensity before movement and the measured intensity after movement, but the determination is made based on a plurality of measurement results additionally including the measured intensity further before movement in some cases. For example, the comparison may be performed between two points or among multiple points such as three points or more.

7.4 Effect

With the wavelength conversion system 35 according to Embodiment 5, it is possible to minimize a loss of the second sum frequency light (193.4 nm), which improves the conversion efficiency.

7.5 Modification

In Embodiment 5, angle adjustment of the third CLBO crystal 303 is performed by using a result of non-converted-light measurement, but angle adjustment of each of the first CLBO crystal 301 and the second CLBO crystal 302 may be performed by using a result of non-converted-light measurement. Angle adjustment may be performed by using both a result of converted-light measurement and a result of non-converted-light measurement.

8. Embodiment 6

8.1 Configuration

Figure 21:
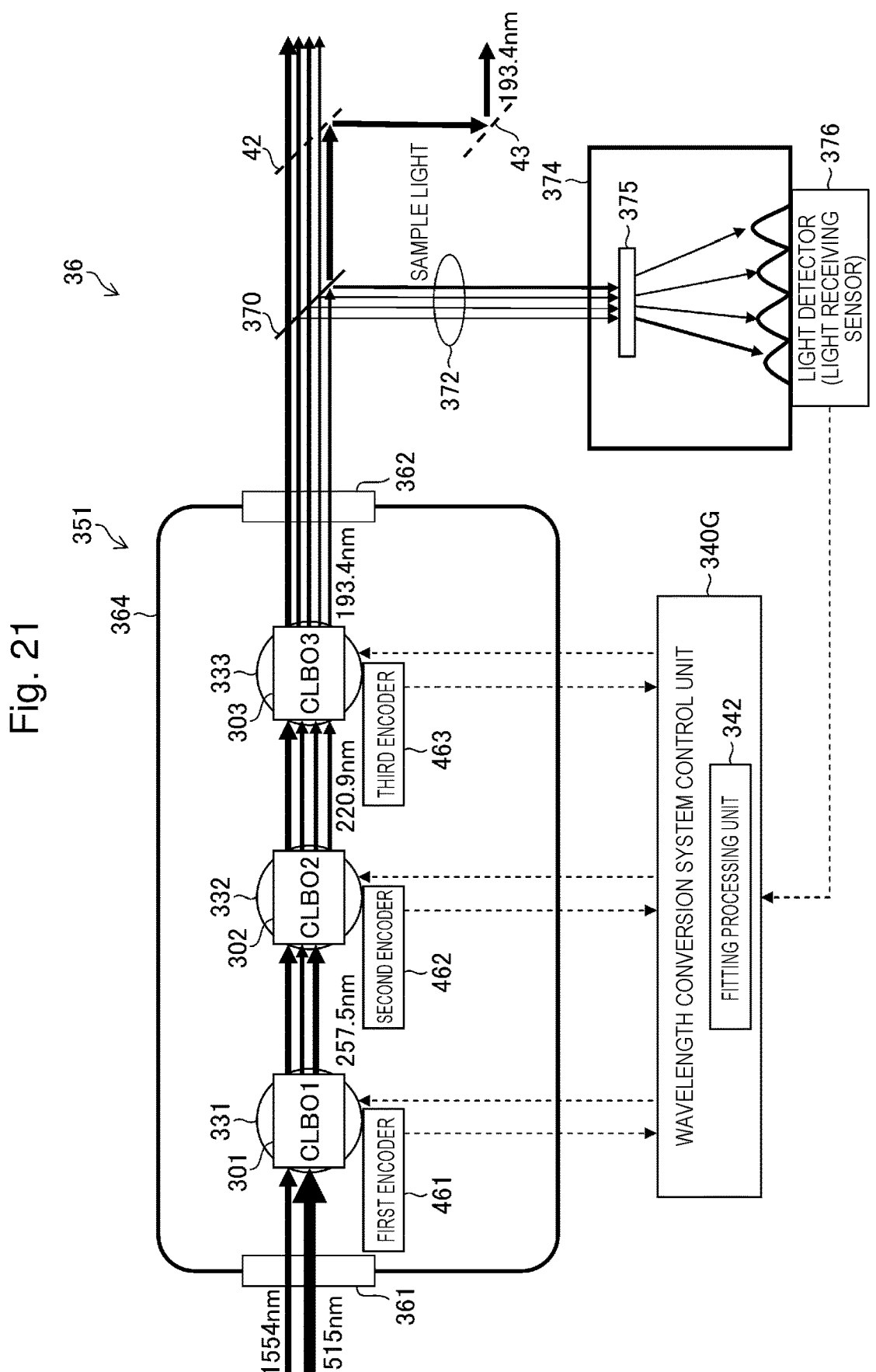
FIG. 21 schematically illustrates a configuration of a wavelength conversion system applied to a solid-state laser system according to Embodiment 6.

FIG. 21 schematically illustrates a configuration of a wavelength conversion system 36 applied to the solid-state laser system 1 according to Embodiment 6. In Embodiment 6, the wavelength conversion system 36 illustrated in FIG. 21 is applied in place of the wavelength conversion system 31 illustrated in FIG. 3. Any difference of the configuration illustrated in FIG. 21 from that in FIG. 3 will be described below.

In Embodiments 1 to 5, angle adjustment of a CLBO crystal is performed by measuring the state of wavelength conversion at the CLBO crystal at multiple points. However, the incident angle on the CLBO crystal and the efficiency of wavelength conversion have the relation of a sinc function in theory. Thus, the angle can be adjusted in a shorter adjustment time by using an actuator and a wavelength conversion system control unit 340G. The actuator is equipped with functions of an encoder that can output angular position information of the CLBO crystal, in other words, rotational position information of its rotation stage and can control the rotational position of the rotation stage. The wavelength conversion system control unit 340G has a function to perform fitting processing of a plurality of pieces of position information obtained from the encoder and a function to control the actuator based on a result of the fitting processing.

The first rotation stage 331, the second rotation stage 332, and the third rotation stage 333 include a first encoder 461, a second encoder 462, and a third encoder 463, respectively.

The first encoder 461, the second encoder 462, and the third encoder 463 are each connected to the wavelength conversion system control unit 340G. The first encoder 461, the second encoder 462, and the third encoder 463 each output, to the wavelength conversion system control unit 340G, position information such as current coordinate information of the corresponding CLBO crystal based on the state of the corresponding rotation stage in accordance with a command from the wavelength conversion system control unit 340G.

The wavelength conversion system control unit 340G includes a fitting processing unit 342. The fitting processing unit 342 performs fitting processing of data in which an output from each of the first encoder 461, the second encoder 462, and the third encoder 463 is associated with intensity at each wavelength.

8.2 Operation

Figure 22:
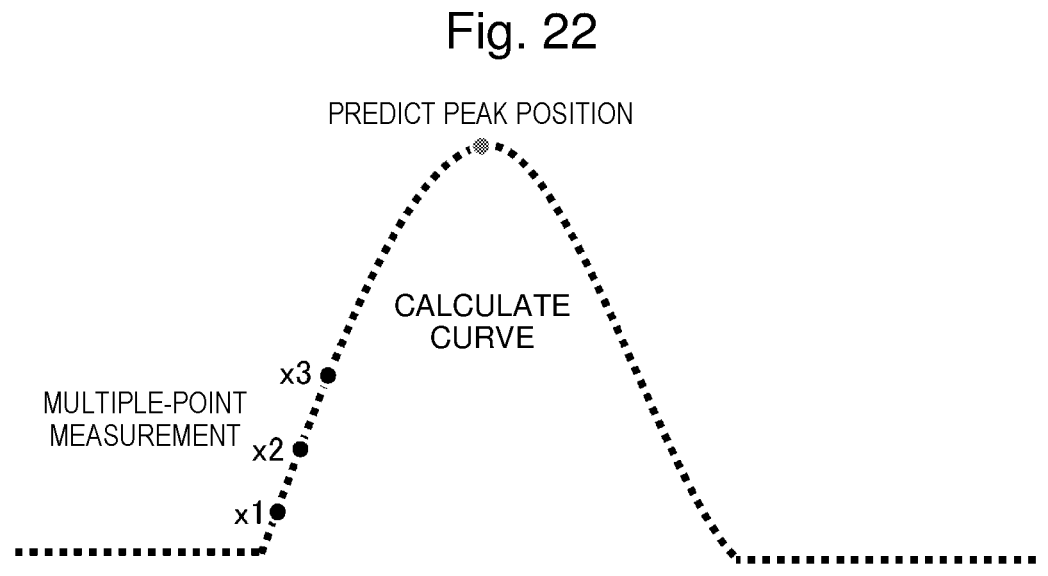

FIG. 22 is a concept diagram of arithmetic processing of predicting a peak position based on a plurality of measurement results by fitting processing. In FIG. 22, the horizontal axis represents the angular position of a CLBO crystal and the vertical axis represents the light intensity of converted light. Points x1, x2, and x3 in FIG. 22 are points at which a measurement result is plotted. For example, it is possible to perform the initial alignment with a reduced number of times of measurement and a reduced number of times of movement by measuring a plurality of points of increase and decrease and then calculating an increase-decrease curve by fitting based on a result of the measurement to obtain the coordinate angular position of an apex (peak).

Moreover, the wavelength conversion system control unit 340G can obtain not only a peak position but also a stable positional relation at a desired output position, and thus system stabilization can be achieved.

8.3 Converted-Light Peak-Value Search Routine

Figure 23:
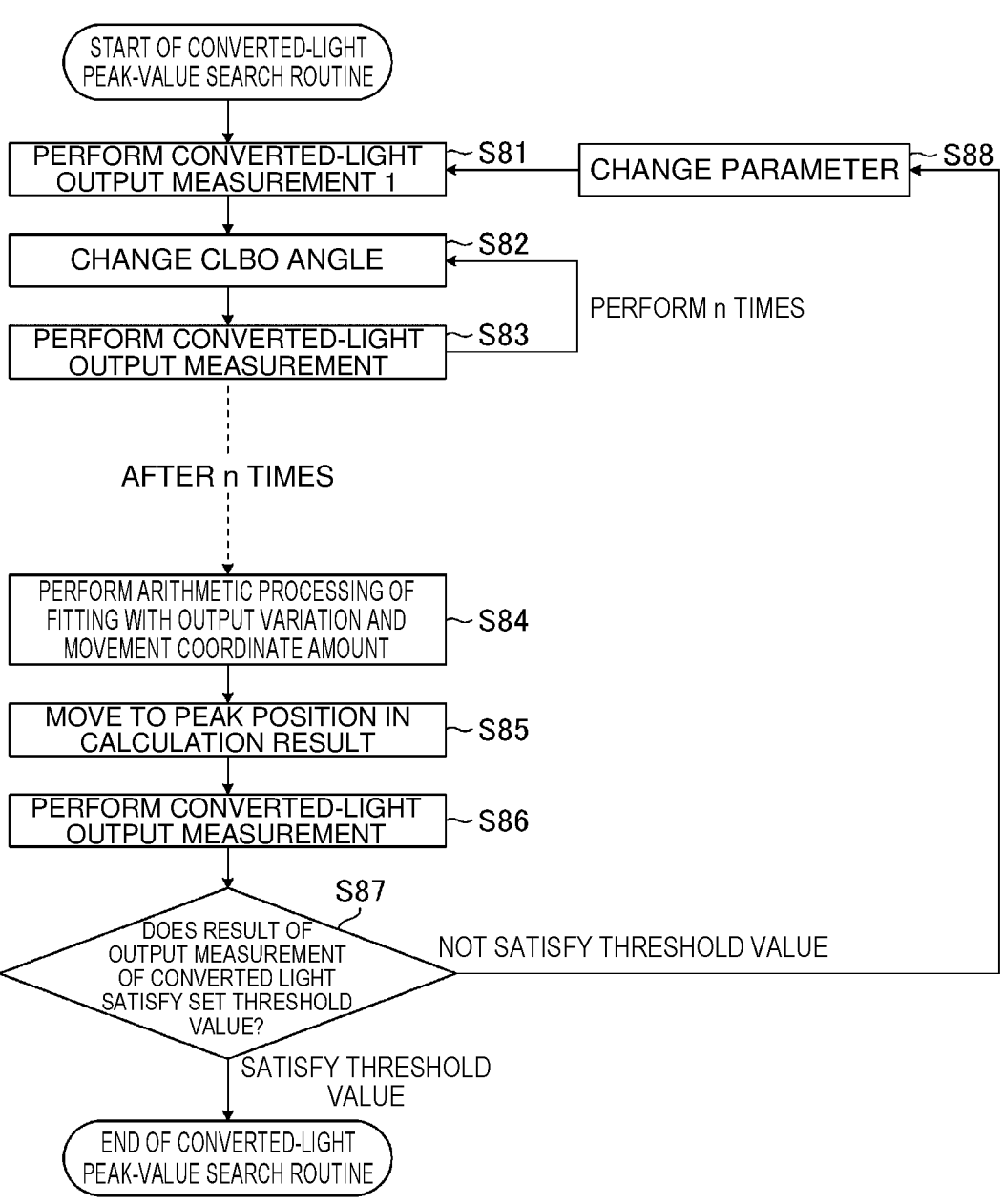
FIG. 23 is a flowchart illustrating an example of a converted-light peak-value search routine applied in Embodiment 6.

FIG. 23 is a flowchart illustrating an example of the converted-light peak-value search routine applied in Embodiment 6. The flowchart illustrated in FIG. 23 is applied in place of the flowchart described above with reference to FIG. 8.

At step S81, the wavelength conversion system control unit 340G performs converted-light output measurement 1. At step S81, the light intensity of converted light before angle change (before movement) is measured.

Subsequently at step S82, the wavelength conversion system control unit 340G changes the angle of a target CLBO crystal by a predetermined angle change amount.

At step S83, the wavelength conversion system control unit 340G performs converted-light output measurement. At step S83, the light intensity of converted light after angle change (after movement) is measured. The measurement is performed at a plurality of measurement points (n points) through n-time repetitions of steps S82 and S83. The number n is preferably an integer equal to or larger than three. The number n is preferably set to the smallest value in a range in which fitting accuracy can be ensured. For example, n may be equal to or larger than three and equal to or smaller than six.

The wavelength conversion system control unit 340G repeats steps S82 and S83 n times and then proceeds to step S84.

At step S84, the wavelength conversion system control unit 340G performs arithmetic processing of fitting with an output variation and a movement coordinate amount based on results of measurement at n measurement points. Step S84 includes calculation to specify an angular position (coordinate) corresponding to a peak value based on increase-decrease curve fitting.

Subsequently at step S85, the wavelength conversion system control unit 340G moves the angle of the CLBO crystal to the coordinate of the peak position in the result of the calculation at step S84.

Subsequently at step S86, the wavelength conversion system control unit 340G performs converted-light output measurement at the coordinate of the peak position.

Subsequently at step S87, the wavelength conversion system control unit 340G determines whether the output of converted light satisfies a set threshold value. When comparison of the intensity measured value of converted light with the set threshold value indicates that the intensity measured value is equal to or larger than the set threshold value (when the output of converted light satisfies the set threshold value), the wavelength conversion system control unit 340G ends the flowchart in FIG. 23 and returns to the main routine in FIG. 5.

When the output of converted light does not satisfy the set threshold value as a result of the determination at step S87, the wavelength conversion system control unit 340G proceeds to step S88 to change any parameter and then returns to step S81 to repeat the converted-light peak-value search routine.

As described above, in Embodiment 6, the light intensity of converted light is measured at a plurality of measurement points, and then, fitting calculation is performed with the angular position coordinate and the measured value and movement is made to the coordinate of a predicted peak value. Alignment is completed when a light intensity value measured at the coordinate is equal to or larger than the set threshold value.

8.4 Effect

With a configuration not including an encoder, a value indicating the angle of a CLBO crystal on a position coordinate system cannot be referred to, and thus narrowing to an optimum position is performed by performing determination of whether the light intensity increases or decreases while change of the CLBO crystal angle and traveling the movement range for a plurality of times with change of the movement direction and the angle change amount. However, with a configuration including an encoder as in Embodiment 6, a peak position can be calculated and predicted based on the values of several measurement points on a position coordinate system and the measured value of the light intensity, and thus the number of times of measurement and movement can be significantly reduced.

8.5 Modification

Although the example in which the output of converted light is measured is described above with reference to FIGS.

22 and 23, the same prediction of a position corresponding to the bottom value by using fitting processing may be performed for a case in which the output of non-converted light is measured as described in Embodiment 5.

9. Embodiment 7

9.1 Configuration

Figure 24:
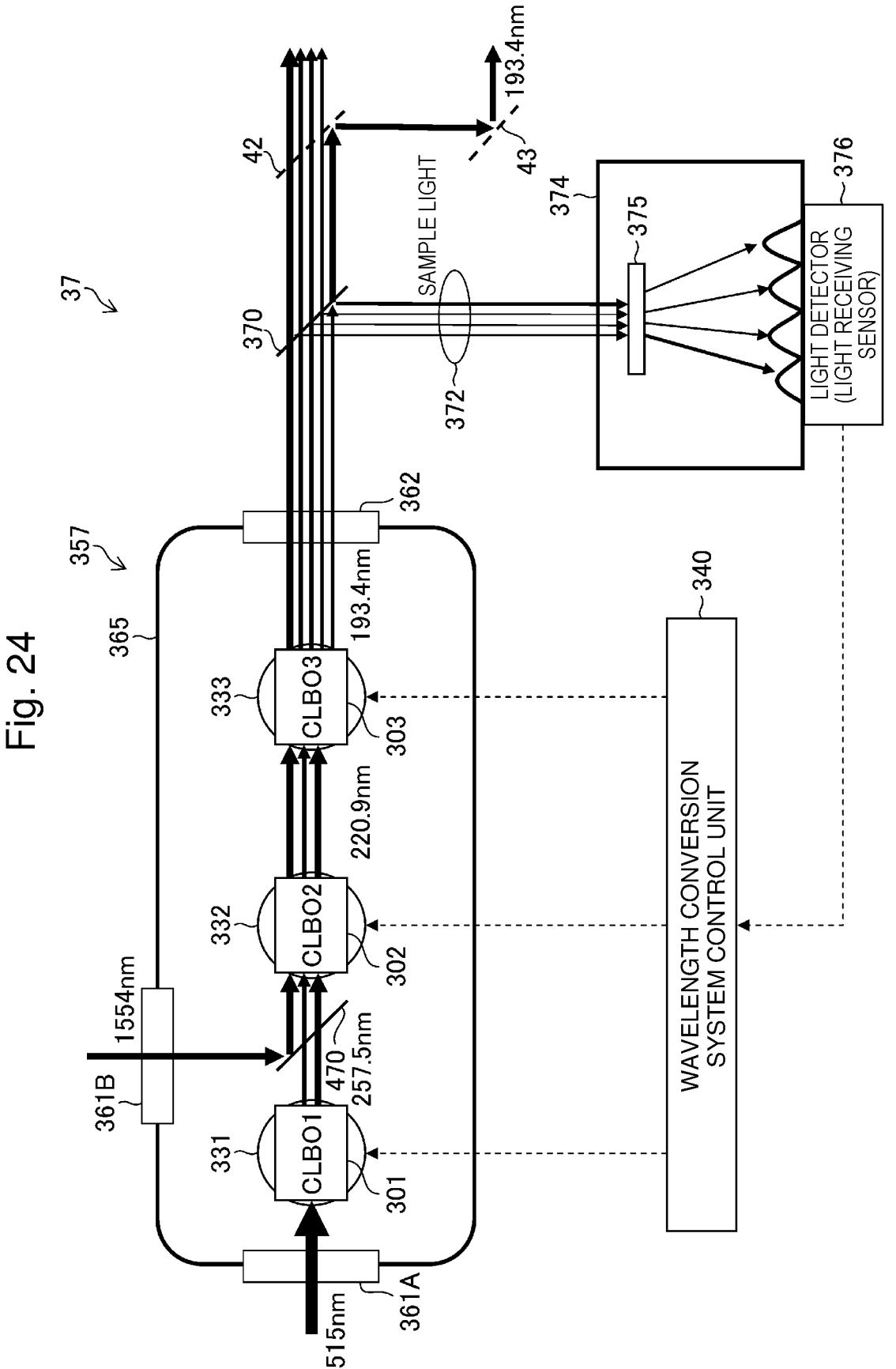
FIG. 24 schematically illustrates a configuration of a wavelength conversion system according to Embodiment 7.

FIG. 24 schematically illustrates a configuration of a wavelength conversion system 37 according to Embodiment 7. In Embodiment 7, the wavelength conversion system 37 illustrated in FIG. 24 is applied in place of the wavelength conversion system 30 illustrated in FIG. 3. Any difference of the configuration illustrated in FIG. 24 from that in FIG. 3 will be described below.

In the configuration illustrated in FIG. 3, the first pulse laser beam having a wavelength of 515 nm approximately and the second pulse laser beam having a wavelength of 1554 nm approximately are incident on the CLBO cell box 351 in the same direction. However, the wavelength conversion system 37 illustrated in FIG. 24 has a configuration in which the first pulse laser beam having a wavelength of 515 nm approximately and the second pulse laser beam having a wavelength of 1554 nm approximately are incident on a CLBO cell box 357 in directions different from each other.

In other words, the wavelength conversion system 37 includes the CLBO cell box 357 in place of the CLBO cell box 351 in FIG. 3. The CLBO cell box 357 includes a container 365 provided with a first entrance window 361A, a second entrance window 361B, and the emission window 362. The first CLBO crystal 301, a dichroic mirror 470, the second CLBO crystal 302, and the third CLBO crystal 303 are disposed in the container 365.

The first entrance window 361A is a window through which a pulse laser beam having a wavelength of 515 nm approximately is incident. The first CLBO crystal 301 is disposed such that the first pulse laser beam having transmitted through the first entrance window 361A is incident thereon.

The second entrance window 361B is a window through which the second pulse laser beam having a wavelength of 1554 nm approximately is incident. The dichroic mirror 470 is disposed on the optical path between the first CLBO crystal 301 and the second CLBO crystal 302. The dichroic mirror 470 is coated with a film that highly reflects the second pulse laser beam having a wavelength of 1554 nm approximately and highly transmits the first pulse laser beam having a wavelength of 515 nm approximately and the second harmonic light having a wavelength of 257.5 nm approximately. The dichroic mirror 470 is disposed such that the second pulse laser beam having transmitted through the second entrance window 361B and the first pulse laser beam and the second harmonic light output from the first CLBO crystal 301 are incident on the second CLBO crystal 302 with optical path axes matched. This is the same as the configuration illustrated in FIG. 3.

9.2 Operation

The method of angle adjustment of the first CLBO crystal 301, the second CLBO crystal 302, and the third CLBO crystal 303 disposed inside the CLBO cell box 357 is the same as in Embodiment 1.

A pulse laser beam having a wavelength of 257.5 nm approximately and output from the first CLBO crystal 301 in Embodiment 7 is an example of the "first laser beam" in the present disclosure, and the combination of the first solid-state laser apparatus 10 and the first CLBO crystal 301 is an example of the "first laser apparatus" in the present disclosure. The second CLBO crystal 302 illustrated in FIG. 24 is an example of the "first non-linear crystal" in the present disclosure, and the third CLBO crystal 303 is an example of the "second non-linear crystal" in the present disclosure. The first sum frequency light (having a wavelength of 220.9 nm approximately) output from the second CLBO crystal 302 is an example of the "first wavelength-converted light" in the present disclosure, and the second sum frequency light (having a wavelength of 193.4 nm approximately) output from the third CLBO crystal 303 is an example of the "second wavelength-converted light" in the present disclosure.

9.3 Effect

The wavelength conversion system 37 according to Embodiment 7 may be used in, for example, a case in which there is an arrangement restriction on a device structure. According to Embodiment 7, similarly to Embodiment 1, the number of optical elements between CLBO crystals is smaller and a light transmission loss is smaller than in the configuration in FIG. 2.

Moreover, the size of the CLBO cell box 357 can be reduced as compared to the comparative example illustrated in FIG. 2.

10. Embodiment 8

10.1 Configuration

Figure 25:
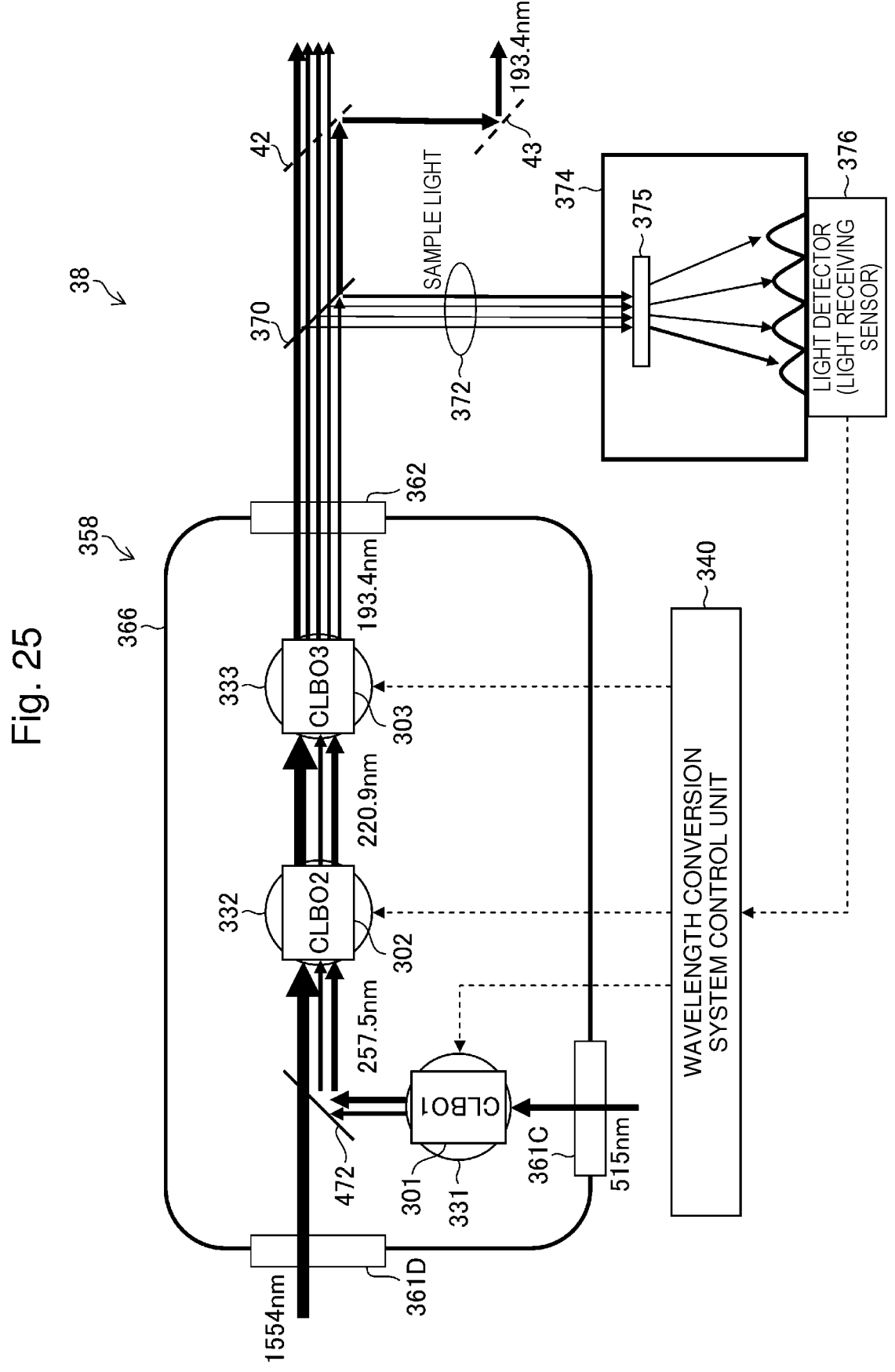
FIG. 25 schematically illustrates a configuration of a wavelength conversion system according to Embodiment 8.

FIG. 25 schematically illustrates a configuration of a wavelength conversion system 38 according to Embodiment 8. The wavelength conversion system 38 illustrated in FIG. 25 may be applied in place of the wavelength conversion system 37 according to Embodiment 7 illustrated in FIG. 24. Any difference of the configuration illustrated in FIG. 25 from that in FIG. 24 will be described below.

The wavelength conversion system 38 includes a CLBO cell box 358 in place of the CLBO cell box 357 illustrated in FIG. 24. The CLBO cell box 358 includes a container 366 provided with a first entrance window 361C, a second entrance window 361D, and the emission window 362. The first CLBO crystal 301, a dichroic mirror 472, the second CLBO crystal 302, and the third CLBO crystal 303 are disposed in the container 366.

The first entrance window 361C is a window through which a pulse laser beam having a wavelength of 515 nm approximately is incident. The first CLBO crystal 301 is disposed such that the first pulse laser beam having transmitted through the first entrance window 361C is incident thereon.

The second entrance window 361B is a window through which the second pulse laser beam having a wavelength of 1554 nm approximately is incident. The dichroic mirror 472 is disposed on an optical path between the second entrance window 361D and the second CLBO crystal 302. The dichroic mirror 472 is coated with a film that highly transmits the second pulse laser beam having a wavelength of 1554 nm approximately and highly reflects the first pulse laser beam having a wavelength of 515 nm approximately and the second harmonic light having a wavelength of 257.5 nm approximately. The dichroic mirror 472 is disposed such that the second pulse laser beam having transmitted through the second entrance window 361D and the first pulse laser beam and the second harmonic light emitted from the first CLBO crystal 301 are incident on the second CLBO crystal 302 with their optical path axes matched. The other configuration is the same as the configuration illustrated in FIG. 24.

10.2 Operation

The method of angle adjustment of the first CLBO crystal 301, the second CLBO crystal 302, and the third CLBO crystal 303 disposed inside the CLBO cell box 358 is the same as in Embodiment 1.

A pulse laser beam having a wavelength of 257.5 nm approximately and output from the first CLBO crystal 301 in Embodiment 8 is an example of the "first laser beam" in the present disclosure, and the combination of the first solid-state laser apparatus 10 and the first CLBO crystal 301 is an example of the "first laser apparatus" in the present disclosure. The second CLBO crystal 302 illustrated in FIG. 25 is an example of the "first non-linear crystal" in the present disclosure, and the third CLBO crystal 303 is an example of the "second non-linear crystal" in the present disclosure.

10.3 Effect

The wavelength conversion system 38 according to Embodiment 8 may be used in, for example, a case in which there is an arrangement restriction on a device structure. According to Embodiment 8, similarly to Embodiment 1, the number of optical elements between CLBO crystals is smaller and a light transmission loss is smaller than in the configuration in FIG. 2.

Moreover, the size of the CLBO cell box 358 can be reduced as compared to the comparative example illustrated in FIG. 2.

11. Phase Matching of Non-Linear Crystal

When light of the fundamental wave is input to a non-linear crystal such as a CLBO crystal, the phases of harmonics generated from the fundamental wave through wavelength conversion at places in the crystal are typically not aligned and thus are balanced out among the harmonics generated in the crystal. In this manner, since the phases of harmonics generated at places in the crystal are shifted from one another, difference in the traveling speed and difference in the refractive index occur to the fundamental wave and the harmonics.

The phases of harmonics generated at places in the crystal need to be aligned to efficiently generate the harmonics. The phase shift is resolved when the refractive index is the same for the fundamental wave and the harmonics. Specifically, the phases are aligned by changing the refractive index through adjustment of the temperature of the non-linear crystal and the incident angle on the non-linear crystal. Such matching of the phases of converted light generated in the non-linear crystal is referred to as phase matching.

Since a non-linear crystal is birefringent, the refractive index thereof is different between polarization directions. Matching in the refractive index between an ordinary beam of the fundamental wave and an extraordinary beam of a harmonic is referred to as angle phase matching.

The phase matching does not necessarily need to be achieved by adjusting the incident angle on a non-linear crystal but may be achieved by adjusting the temperature of the non-linear crystal or by combining these adjustments.

The above description is not limited to harmonic generation but also applies to sum frequency wave generation as well, and the wavelength conversion efficiency can be increased by matching the phases of sum frequency waves (converted light) generated at places in a crystal. When the phase matching is performed by temperature control of a non-linear crystal, the temperature of each non-linear crystal may be individually adjusted. For example, temperature adjustment devices including heaters or the like for individually controlling the temperatures of the first CLBO crystal 301, the second CLBO crystal 302, and the third CLBO crystal 303, respectively, are examples of the "first adjustment unit", the "second adjustment unit", and the "third adjustment unit" in the present disclosure. The individual temperature adjustment devices for the crystals may be used with their rotation stages for angle adjustment.

12. Electronic Device Manufacturing Method

Figure 26:
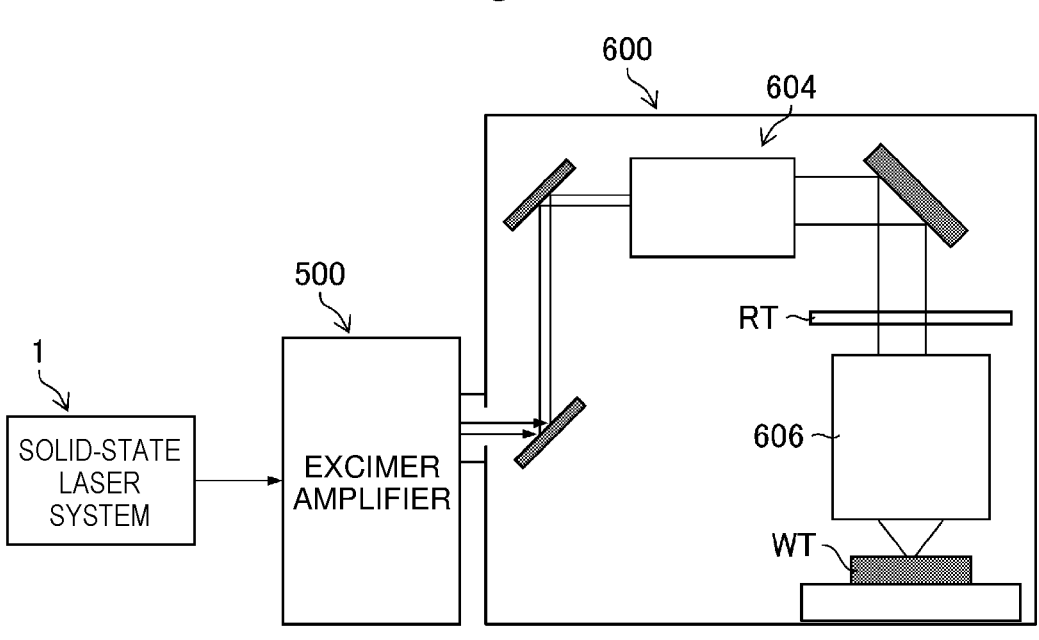
FIG. 26 schematically illustrates a configuration of an exposure apparatus.

FIG. 26 schematically illustrates an exemplary configuration of an exposure apparatus 600. An electronic device manufacturing method is performed by using the solid-state laser system 1, an excimer amplifier 500, and the exposure apparatus 600. The excimer amplifier 500 may be omitted.

The excimer amplifier 500 may be, for example, an ArF excimer laser apparatus configured to amplify a pulse laser beam output from the solid-state laser system 1. The combination of the solid-state laser system 1 and the excimer amplifier 500 forms a hybrid laser apparatus. The pulse laser beam amplified by the excimer amplifier 500 is input to the exposure apparatus 600 and is used as exposure light.

The exposure apparatus 600 includes an illumination optical system 604 and a projection optical system 606. The illumination optical system 604 illuminates a reticle pattern on a reticle stage RT with an excimer laser beam incident from the excimer amplifier 500. A laser beam having transmitted through the reticle is imaged on a non-illustrated workpiece disposed on a workpiece table WT by reduced projection through the projection optical system 606. The workpiece is a photosensitive substrate such as a semiconductor wafer on which a photoresist is applied.

The exposure apparatus 600 translates the reticle stage RT and the workpiece table WT in synchronization to expose the workpiece to a laser beam on which the reticle pattern is reflected. The reticle pattern is transferred to the semiconductor wafer through the exposure process as described above, and then a plurality of processes are performed to manufacture a semiconductor device. The semiconductor device is an example of an "electronic device" in the present disclosure. The solid-state laser system 1 may include any of the wavelength conversion systems 31 and 33 to 38 described above in Embodiments 1 to 8. The pulse laser beam amplified by the excimer amplifier 500 is an example of the "third laser beam" in the present disclosure.

13. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A solid-state laser system comprising:
a first laser apparatus configured to output a first laser beam;
a second laser apparatus configured to output a second laser beam;
a first non-linear crystal that generates first wavelength-converted light based on the first laser beam;
a first adjustment unit configured to perform phase matching of the first wavelength-converted light in the first non-linear crystal, the first adjustment unit including a first angle adjustment mechanism configured to change a first incident angle of light on the first non-linear crystal;
a second non-linear crystal that is disposed on an optical path of the first wavelength-converted light and generates second wavelength-converted light based on the first wavelength-converted light and the second laser beam;
a second adjustment unit configured to perform phase matching of the second wavelength-converted light in the second non-linear crystal, the second adjustment unit including a second angle adjustment mechanism configured to change a second incident angle of light on the second non-linear crystal;
a wavelength selection element disposed on an optical path of light output from the second non-linear crystal;
a light detection unit configured to detect light having a wavelength selected by passing through the wavelength selection element; and
a processor configured to:
control the first adjustment unit based on at least one of intensity of the first wavelength-converted light having passed through the second non-linear crystal and detected by the light detection unit and intensity of the first laser beam having passed through the second non-linear crystal and detected by the light detection unit;
perform the phase matching of the first wavelength-converted light by controlling the first angle adjustment mechanism to adjust the first incident angle to maximize the intensity of the first wavelength-converted light or minimize the intensity of the first laser beam;
control the second adjustment unit based on at least one of intensity of the second wavelength-converted light detected by the light detection unit, the intensity of the first wavelength-converted light having passed through the second non-linear crystal and detected by the light detection unit and intensity of the second laser beam having passed through the second non-linear crystal and detected by the light detection unit; and
perform the phase matching of the second wavelength-converted light by controlling the second angle adjustment mechanism to adjust the second incident angle to maximize the intensity of the second wavelength-converted light or minimize one of the intensity of the first wavelength-converted light and the intensity of the second laser beam.

2. The solid-state laser system according to claim 1, wherein
the first wavelength-converted light is second harmonic light of the first laser beam, and
the second wavelength-converted light is first sum frequency light having a wavelength corresponding to a sum frequency of the second harmonic light and the second laser beam.

3. The solid-state laser system according to claim 1, further comprising:
a third non-linear crystal that is disposed on an optical path between the second non-linear crystal and the wavelength selection element and generates third wavelength-converted light based on the second wavelength-converted light and the second laser beam; and
a third adjustment unit configured to perform phase matching of the third wavelength-converted light in the third non-linear crystal, the third adjustment unit including a third angle adjustment mechanism configured to change a third incident angle of light on the third non-linear crystal, wherein:
light output from the third non-linear crystal is incident on the light detection unit through the wavelength selection element; and
the processor is further configured to:
control the third adjustment unit based on at least one of intensity of the third wavelength-converted light detected by the light detection unit, intensity of the second wavelength-converted light having passed through the third non-linear crystal and detected by the light detection unit and intensity of the second laser beam having passed through the third non-linear crystal and detected by the light detection unit; and
perform the phase matching of the third wavelength-converted light by controlling the third angle adjustment mechanism to adjust the third incident angle to maximize the intensity of the third wavelength-converted light or minimize one of the intensity of the second wavelength-converted light and the intensity of the second laser beam.

4. The solid-state laser system according to claim 3, wherein the third wavelength-converted light is second sum frequency light having a wavelength corresponding to a sum frequency of the second wavelength-converted light and the second laser beam.

5. The solid-state laser system according to claim 3, further comprising a distribution optical element that is disposed on an optical path between the third non-linear crystal and the wavelength selection element and configured to guide part of light having passed through the third non-linear crystal to the light detection unit.

6. The solid-state laser system according to claim 5, wherein the distribution optical element includes at least one of a beam splitter and a dichroic mirror.

7. The solid-state laser system according to claim 1, further comprising an encoder configured to detect an angular position of each of the first angle adjustment mechanism and the second angle adjustment mechanism,
wherein the processor is further configured to perform calculation to specify at least one of an angular position of maximum light intensity and an angular position of minimum light intensity based on a plurality of measurement results in which the angular position detected by the encoder and a measured value of intensity detected by the light detection unit are recorded in association with each other.

8. The solid-state laser system according to claim 1, wherein the wavelength selection element includes at least one of a grating, a dichroic mirror, and a wavelength filter.

9. The solid-state laser system according to claim 1, wherein the light detection unit includes a plurality of light detection elements corresponding to a plurality of wavelengths selected by using the wavelength selection element.

10. The solid-state laser system according to claim 1, further comprising a container that houses a plurality of non-linear crystals including the first non-linear crystal and the second non-linear crystal, wherein inert gas is supplied into the container.

11. The solid-state laser system according to claim 1, wherein the first wavelength-converted light is first sum frequency light having a wavelength corresponding to a sum frequency of the first laser beam and the second laser beam, and the second wavelength-converted light is second sum frequency light having a wavelength corresponding to a sum frequency of the first sum frequency light and the second laser beam.

12. A phase matching method for a wavelength conversion system including a first non-linear crystal that generates first wavelength-converted light based on a first laser beam and a second non-linear crystal that generates second wavelength-converted light based on the first wavelength-converted light output from the first non-linear crystal and a second laser beam, the phase matching method comprising:

detecting at least one of the first wavelength-converted light and the first laser beam having passed through the second non-linear crystal;

performing phase matching of the first wavelength-converted light in the first non-linear crystal based on at least one of intensity of the first wavelength-converted light and intensity of the first laser beam thus detected;

detecting at least one of the second wavelength-converted light output from the second non-linear crystal, and the first wavelength-converted light and the second laser beam having passed through the second non-linear crystal after having performed adjustment in which the phase matching of the first wavelength-converted light is performed in the first non-linear crystal; and performing phase matching of the second wavelength-converted light in the second non-linear crystal based on at least one of intensity of the second wavelength-converted light, intensity of the first wavelength-converted light and intensity of the second laser beam thus detected, wherein:

the phase matching of the first wavelength-converted light includes adjusting a first incident angle of light on the first non-linear crystal to maximize the intensity of the first wavelength-converted light or minimize the intensity of the first laser beam; and the phase matching of the second wavelength-converted light includes adjusting a second incident angle of light on the second non-linear crystal to maximize the intensity of the second wavelength-converted light or minimize one of the intensity of the first wavelength-converted light and the intensity of the second laser beam.

13. The phase matching method according to claim 12, wherein the detecting at least one of the first wavelength-converted light and the first laser beam includes:

detecting the first wavelength-converted light having passed through the second non-linear crystal; and specifying a maximum value of the intensity of the first wavelength-converted light based on a result of the detection of the first wavelength-converted light.

14. The phase matching method according to claim 12, wherein the detecting at least one of the second wavelength-converted light, and the first wavelength-converted light and the second laser beam having passed through the second non-linear crystal includes:

detecting the second wavelength-converted light output from the second non-linear crystal; and specifying a maximum value of the intensity of the second wavelength-converted light based on a result of the detection of the second wavelength-converted light.

15. The phase matching method according to claim 12, wherein the wavelength conversion system further includes a third non-linear crystal that generates third wavelength-converted light based on the second wavelength-converted light and the second laser beam, and the phase matching method further comprises:

detecting at least one of the third wavelength-converted light output from the third non-linear crystal, and the second wavelength-converted light and the second laser beam having passed through the third non-linear crystal after having performed adjustment in which the phase matching of the second wavelength-converted light is performed in the second non-linear crystal; and performing phase matching of the third wavelength-converted light in the third non-linear crystal based on at least one of intensity of the third wavelength-converted light, intensity of the second wavelength-converted light and intensity of the second laser beam thus detected, wherein the phase matching of the third wavelength-converted light includes adjusting a third incident angle of light on the third non-linear crystal to maximize the intensity of the third wavelength-converted light or minimize one of the intensity of the second wavelength-converted light and the intensity of the second laser beam.

16. The phase matching method according to claim 15, wherein the detecting at least one of the third wavelength-converted light, and the second wavelength-converted light and the second laser beam having passed through the third non-linear crystal includes:

detecting the second wavelength-converted light having passed through the third non-linear crystal; and specifying a minimum value of the intensity of the second wavelength-converted light based on a result of the detection of the second wavelength-converted light.

17. The phase matching method according to claim 12, further comprising:

finding the first wavelength-converted light before the detecting at least one of the first wavelength-converted light and the first laser beam, and finding the second wavelength-converted light before the detecting at least one of the second wavelength-converted light and the first wavelength-converted light having passed through the second non-linear crystal.

18. An electronic device manufacturing method comprising:

generating a third laser beam by using a solid-state laser system, the solid-state laser system including a first laser apparatus configured to output a first laser beam, a second laser apparatus configured to output a second laser beam, a first non-linear crystal that generates first wavelength-converted light based on the first laser beam, a first adjustment unit configured to perform phase matching of the first wavelength-converted light in the first non-linear crystal, the first adjustment unit including a first angle adjustment mechanism configured to change a first incident angle of light on the first non-linear crystal, a second non-linear crystal that is disposed on an optical path of the first wavelength-converted light and generates second wavelength-converted light based on the first wavelength-converted light and the second laser beam, a second adjustment unit configured to perform phase matching of the second wavelength-converted light in the second non-linear crystal, the second adjustment unit including a second angle adjustment mechanism configured to change a second incident angle of light on the second non-linear crystal, a wavelength selection element disposed on an optical path of light output from the second non-linear crystal, a light detection unit configured to detect light having a wavelength selected by passing through the wavelength selection element, and a processor configured to:

control the first adjustment unit based on at least one of intensity of the first wavelength-converted light having passed through the second non-linear crystal and detected by the light detection unit and intensity of the first laser beam having passed through the second non-linear crystal and detected by the light detection unit;

perform the phase matching of the first wavelength-converted light by controlling the first angle adjustment mechanism to adjust the first incident angle to maximize the intensity of the first wavelength-converted light or minimize the intensity of the first laser beam;

control the second adjustment unit based on at least one of intensity of the second wavelength-converted light detected by the light detection unit, the intensity of the first wavelength-converted light having passed through the second non-linear crystal and detected by the light detection unit and intensity of the second laser beam having passed through the second non-linear crystal and detected by the light detection unit; and perform the phase matching of the second wavelength-converted light by controlling the second angle adjustment mechanism to adjust the second incident angle to maximize the intensity of the second wavelength-converted light or minimize one of the intensity of the first wavelength-converted light and the intensity of the second laser beam;

outputting the third laser beam to an exposure apparatus; and exposing a photosensitive substrate to the third laser beam in the exposure apparatus to manufacture an electronic device.

* * * * *